US008856279B2

(12) United States Patent
Stavrakos et al.

(10) Patent No.: US 8,856,279 B2
(45) Date of Patent: *Oct. 7, 2014

(54) METHOD AND SYSTEM FOR OBJECT PREDICTION

(75) Inventors: Nicholas Stavrakos, Mountain View, CA (US); Jeff Monks, Sunnyvale, CA (US); Fred Koopmans, Menlo Park, CA (US); Chris Koopmans, Sunnyvale, CA (US); Kapiil Dakhane, Sunnyvale, CA (US)

(73) Assignee: Citrix Systems Inc., Fort Lauderdale, FL (US)

( * ) Notice: Subject to any disclaimer, the term of this patent is extended or adjusted under 35 U.S.C. 154(b) by 963 days.

This patent is subject to a terminal disclaimer.

(21) Appl. No.: 11/439,003

(22) Filed: May 22, 2006

(65) Prior Publication Data

US 2006/0271641 A1 Nov. 30, 2006

Related U.S. Application Data

(60) Provisional application No. 60/685,260, filed on May 26, 2005.

(51) Int. Cl.
*G06F 15/16* (2006.01)
*H04L 29/06* (2006.01)
*H04L 29/08* (2006.01)
*H03M 7/30* (2006.01)
*H04W 8/22* (2009.01)
*G06F 17/30* (2006.01)
*H04W 8/24* (2009.01)

(52) U.S. Cl.
CPC .............. *H04W 8/22* (2013.01); *H04L 29/06* (2013.01); *H04W 8/245* (2013.01); *H04L 67/02* (2013.01); *H03M 7/30* (2013.01); *G06F 17/30902* (2013.01); *H04L 67/2852* (2013.01); *H04L 67/2828* (2013.01)

USPC ............ 709/219; 709/203; 709/218; 709/245

(58) Field of Classification Search
None
See application file for complete search history.

(56) References Cited

U.S. PATENT DOCUMENTS 5,787,470 A * 7/1998 DeSimone et al. ........... 711/124
5,802,292 A * 9/1998 Mogul .......................... 709/203

(Continued)

FOREIGN PATENT DOCUMENTS

EP   1 206 100 A1   5/2002
EP   1 398 715 A2   3/2004

(Continued)

OTHER PUBLICATIONS

International Preliminary Report on Patentability for PCT/US2006/019988, mailed on Dec. 13, 2007.

(Continued)

*Primary Examiner* — Ian N Moore
*Assistant Examiner* — Dung B Huynh
(74) *Attorney, Agent, or Firm* — Finnegan, Henderson, Farabow, Garrett & Dunner, LLP

(57) ABSTRACT

A method including communicating with a content server, wherein the communication includes transmitting request data to the content server and receiving first response data associated with the request data; identifying response object data within the first response data; determining whether the response object data is to be downloaded; querying the content server for second response data that corresponds to the response object data based on the determination; transmitting the first response data to a user agent; and storing the second response data, wherein the second response data can be provided to the user agent in a subsequent request.

39 Claims, 13 Drawing Sheets

(56) References Cited

U.S. PATENT DOCUMENTS

| | | | | |
|---|---|---|---|---|
| 5,931,904 | A * | 8/1999 | Banga et al. | 709/217 |
| 5,987,510 | A * | 11/1999 | Imai et al. | 709/219 |
| 6,012,085 | A * | 1/2000 | Yohe et al. | 709/217 |
| 6,128,627 | A * | 10/2000 | Mattis et al. | 1/1 |
| 6,154,767 | A * | 11/2000 | Altschuler et al. | 709/203 |
| 6,256,712 | B1 * | 7/2001 | Challenger et al. | 711/141 |
| 6,393,526 | B1 * | 5/2002 | Crow et al. | 711/137 |
| 6,427,172 | B1 * | 7/2002 | Thacker et al. | 709/235 |
| 6,427,187 | B2 * | 7/2002 | Malcolm | 711/119 |
| 6,598,048 | B2 * | 7/2003 | Carneal et al. | 707/10 |
| 6,665,867 | B1 * | 12/2003 | Ims et al. | 717/173 |
| 6,704,024 | B2 * | 3/2004 | Robotham et al. | 345/581 |
| 6,721,780 | B1 * | 4/2004 | Kasriel et al. | 709/203 |
| 6,751,608 | B1 * | 6/2004 | Cohen et al. | 707/3 |
| 6,766,422 | B2 * | 7/2004 | Beyda | 711/137 |
| 6,772,203 | B1 * | 8/2004 | Feiertag et al. | 709/219 |
| 6,947,440 | B2 * | 9/2005 | Chatterjee et al. | 370/429 |
| 6,947,973 | B2 * | 9/2005 | Shimura et al. | 709/217 |
| 6,990,526 | B1 * | 1/2006 | Zhu | 709/227 |
| 7,340,499 | B1 * | 3/2008 | Casella | 709/201 |
| 7,343,397 | B2 * | 3/2008 | Kochanski | 709/218 |
| 7,343,937 | B2 * | 3/2008 | Kiest, Jr. | 138/98 |
| 7,437,364 | B1 * | 10/2008 | Fredricksen et al. | 707/10 |
| 7,509,404 | B2 * | 3/2009 | Agrawal et al. | 709/223 |
| 7,685,296 | B2 * | 3/2010 | Brill et al. | 709/228 |
| 7,721,294 | B2 * | 5/2010 | Quinet et al. | 719/315 |
| 2001/0023459 | A1 * | 9/2001 | Asami | 709/245 |
| 2002/0010783 | A1 * | 1/2002 | Primak et al. | 709/228 |
| 2002/0010798 | A1 * | 1/2002 | Ben-Shaul et al. | 709/247 |
| 2002/0023145 | A1 * | 2/2002 | Orr et al. | 709/219 |
| 2002/0055966 | A1 * | 5/2002 | Border et al. | 709/200 |
| 2002/0124100 | A1 * | 9/2002 | Adams | 709/232 |
| 2002/0124137 | A1 * | 9/2002 | Ulrich et al. | 711/113 |
| 2003/0004933 | A1 * | 1/2003 | Ben-Yehezkel | 707/3 |
| 2003/0061451 | A1 * | 3/2003 | Beyda | 711/137 |
| 2003/0069926 | A1 * | 4/2003 | Weaver et al. | 709/203 |
| 2003/0078986 | A1 * | 4/2003 | Ayres et al. | 709/217 |
| 2003/0163730 | A1 * | 8/2003 | Roskind et al. | 713/201 |
| 2003/0188021 | A1 * | 10/2003 | Challenger et al. | 709/246 |
| 2003/0188106 | A1 * | 10/2003 | Cohen | 711/133 |
| 2004/0044768 | A1 * | 3/2004 | Takahashi | 709/225 |
| 2004/0068579 | A1 * | 4/2004 | Marmigere et al. | 709/242 |
| 2004/0095923 | A1 * | 5/2004 | Ejzak et al. | 370/352 |
| 2004/0143579 | A1 * | 7/2004 | Nakazawa | 707/10 |
| 2004/0205149 | A1 * | 10/2004 | Dillon et al. | 709/217 |
| 2004/0205165 | A1 * | 10/2004 | Melamed et al. | 709/219 |
| 2005/0021792 | A1 * | 1/2005 | Nishida et al. | 709/229 |
| 2005/0022008 | A1 * | 1/2005 | Goodman et al. | 713/201 |
| 2005/0044242 | A1 * | 2/2005 | Stevens et al. | 709/228 |
| 2005/0071766 | A1 * | 3/2005 | Brill et al. | 715/738 |
| 2005/0144278 | A1 * | 6/2005 | Atamaniouk | 709/225 |
| 2005/0235031 | A1 * | 10/2005 | Schneider et al. | 709/203 |
| 2006/0002327 | A1 * | 1/2006 | Kallio et al. | 370/328 |
| 2006/0010215 | A1 * | 1/2006 | Clegg et al. | 709/206 |
| 2006/0031382 | A1 * | 2/2006 | Pradhakar et al. | 709/217 |
| 2006/0031536 | A1 * | 2/2006 | Eydelman et al. | 709/228 |
| 2006/0144647 | A1 * | 7/2006 | Newville et al. | 187/396 |
| 2006/0179123 | A1 * | 8/2006 | Smith | 709/218 |
| 2006/0271642 | A1 * | 11/2006 | Stavrakos et al. | 709/217 |

FOREIGN PATENT DOCUMENTS

| | | |
|---|---|---|
| WO | WO 99/22316 A1 | 5/1999 |
| WO | WO 01/40971 A2 | 6/2001 |

OTHER PUBLICATIONS

Berners-Lee, T., et al., "RFC1945," http://rfc.net/rfc1945.html, The Internet Society (1996) pp. 1-57.

Fielding, R. et al., "RFC2616," http://rfc.net/rfc2616.html, The Internet Society (1999) pp. 1-165.

International Search Report and Written Opinion of the International Searching Authority for International Application No. PCT/US2006/019988, mailed Oct. 18, 2006, 15 pages.

Krishnamurthy, B., et al., "Key differences between HTTP/1.0 and HTTP/1.1," *Computer Networks,* 31: 1737-1751 (1999).

* cited by examiner

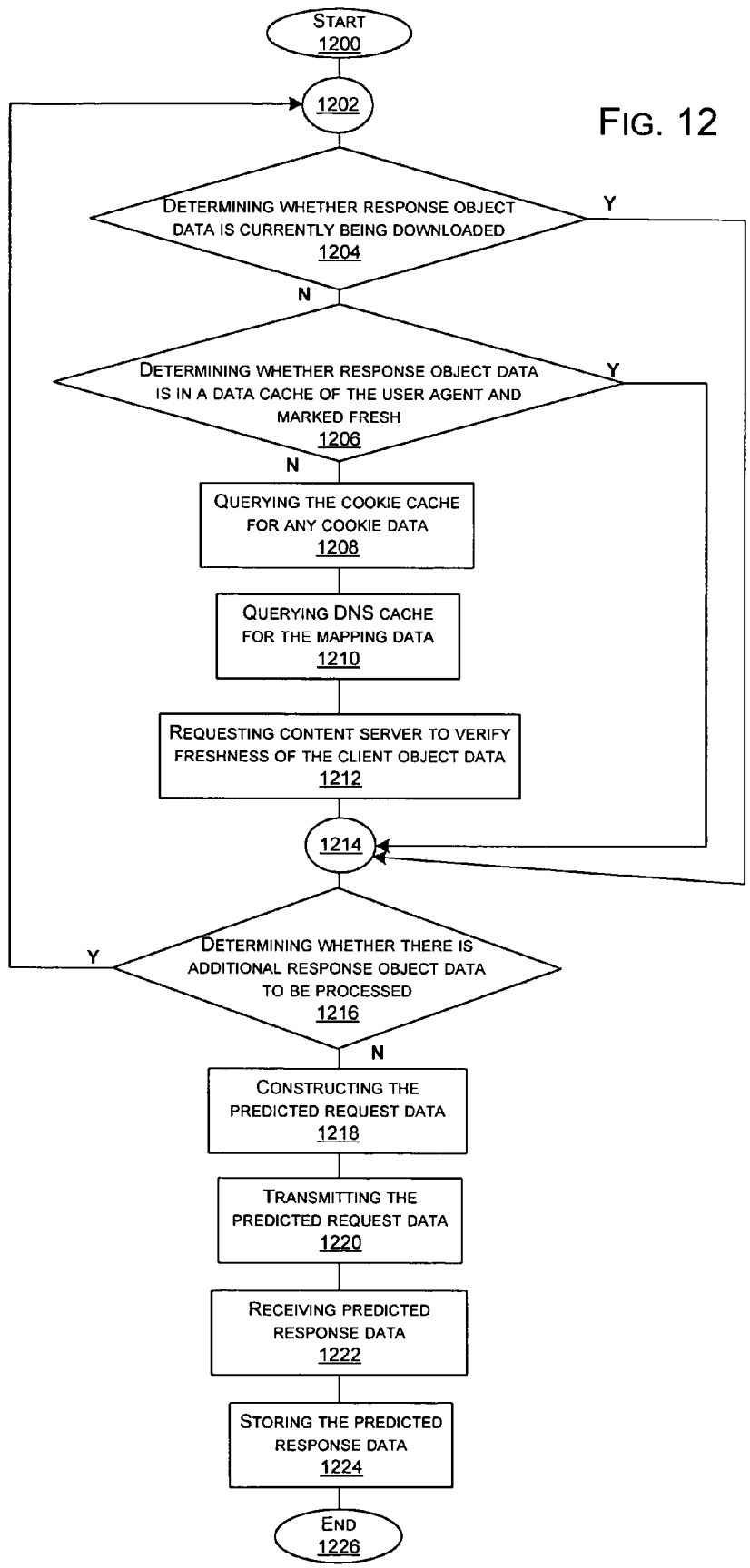

METHOD AND SYSTEM FOR OBJECT PREDICTION

CROSS REFERENCE TO RELATED PATENTS

This application claims the benefit of U.S. Provisional Application No. 60/685,260, filed May 26, 2005, "Advanced Data Optimization." This provisional application is incorporated herein by reference.

BACKGROUND INFORMATION

The Internet allows for vast amounts of information to be communicated over any number of interconnected networks, computers, and network devices. Typically, information or content is located at websites on one or more servers, and a user can retrieve the content using a user agent, such as a web browser, running on a client device. For example, the user can input a webpage address into the web browser or access a web link, which sends requests to a server to access and provide the content on the respective website. This type of communication is commonly referred to as "web browsing."

Web browsing is enjoyed by millions of users on the Internet. However, accessing content on a network that is constrained by bandwidth and latency can make web browsing less enjoyable. Bandwidth is the measurement of the speed of a network link. Lower bandwidth network links take more time to transfer content than higher bandwidth links. Latency is a measurement of the responsiveness of a network link. Higher latency networks take more time than lower latency networks to send a single byte of data over a network link.

Many networks can suffer from low bandwidth and/or high latency problems that degrade the enjoyment of web browsing for users. Wireless wide area networks (WANs), such as GPRS or CDMA 1xRTT wireless networks, are just a few networks, along with traditional plain old telephone (POTS) dialup networks, that can exhibit bandwidth and latency problems. These networks may take 50 to 100 seconds to download content from a web page due to bandwidth and latency constraints, whereas a high-speed local area network (LAN) may be less prone to such constraints and can download the same content in 5 to 10 seconds. Waiting a long time to view content for a web page is annoying to users and inefficiently utilizes the network.

Utilizing a network efficiently is also a particular concern for network providers who must share limited resources among many users. For example, wireless WAN providers share very expensive and limited spectrum among all of its data and voice subscribers. Thus, efficient use of the spectrum frequencies is imperative. Furthermore, in a wireless WAN environment, data transmission is more susceptible to interference and noise in contrast to a wired environment. Interference and noise delay the data transmission process and, more importantly, cause variability and unpredictability in the delay. A web site that may download objects in 50 seconds the first time may download the same objects in 100 seconds the next time. Thus, in order to address these concerns, network providers must efficiently use existing network infrastructure to provide the most efficiency to a user when downloading content.

Furthermore, the manner in which information is transferred on a network plays an important role in the network's efficiency. Referring to the World Wide Web (WWW), the Hypertext Transfer Protocol (HTTP) sets forth the rules for transferring content such as files or objects on the web. This protocol uses requests and responses for transferring content. For example, a user agent (e.g., a web browser) sends a request to the content server for a particular file or object of a web page and the server of the web page queries the object in a database and sends back the object as part of a response to the user agent. This process continues until every object in the web page has been downloaded to the user agent.

As web pages have become more complex, a common website may contain hundreds of objects on its web pages. Such objects may include text, graphics, images, sound, etc. The web pages may also have objects located across multiple servers. That is, one server may provide dynamic content (e.g., content that remembers the last books ordered by a user) for a web page, whereas other servers may provide static but rotating content such as an advertisement, and still others provide the static content of the site. As such, before a user can view a web page, hundreds of objects may require downloading from multiple servers. Each server, however, may take a different amount of time to service a request for an object contributing to latency. Thus, the latency for each server may vary with different levels of magnitude, e.g., one server may respond in milliseconds whereas another server may respond in seconds.

Latency constraints, however, should not be confused with bandwidth constraints. FIG. 1 illustrates the retrieval sequence for objects on a bandwidth constrained network using HTTP over TCP/IP. In this illustration, each request for an object requires a connection to be established between a client and a server with an exchange of "SYN" and "ACK" messages necessary for TCP/IP. Due to the relatively small latency of the network and the responsiveness of the server, the ACK message is sent back to the client quickly. However, because the network is bandwidth constrained, a response back to the client takes a relatively long time. This is exacerbated if the object for the request is large in nature and must be broken into many packets as shown in FIG. 1. As a result, the overall download time for each request/response is dominated by the time it takes to download all the packets of the individual objects on a network link. Such download time can be calculated by adding the size of each of the individual objects and dividing the aggregate size by the link bandwidth.

FIG. 2 illustrates the retrieval sequence for objects on a latency constrained network using HTTP over TCP/IP. In this illustration, the network is not limited by bandwidth, but instead by the latency or the time it takes to send a packet from the client to the server through the network. In particular, when a user agent requests small objects on a network affected by high latency, the overall download time is dominated by the time it takes a request to travel to the server, the responsiveness of the server to process the request, and the time it takes for a response to travel back to user agent. The download time of a web page with many objects can be calculated by adding the round trip time (RTT) for the request to travel to the server and the response to travel back to the client in addition to the response of the server and multiplying that by the number of objects on the web page.

Unfortunately, user agents are in fact a source of latency when downloading an object. This latency is a result of the user agent processing the downloaded objects and attempting to display these objects in the manner the web page designers intended. Web page designers use a multitude of different standards to instruct the user agents how a web page is suppose to look once rendered. The number of standards is increasing over time and include markup languages (e.g., Hyper Text Markup Language (HTML), Extensible HTML (XHTML), Wireless Markup Language (WML)), objects that define the overall style of the page (e.g., Cascading Style Sheets (CSS)), objects that are executed by the user agent (e.g., JavaScript), and image objects (e.g., JPEG, GIF, PNG).

After downloading each object the user agent needs time to process and determine the impact of each object on the displayed web page. The processing time of each object may impact the download of subsequent objects. For CPU constrained devices (e.g., phones) the latency from browser processing time can contribute significantly to the overall download time of a web page. Also, for poorly implemented user agents certain objects may significantly impact the time to render a web page. Even over a high bandwidth and low latency network, the implementation of the user agent can result in these object processing times severely impacting the download time of the web page.

BRIEF DESCRIPTION OF THE DRAWINGS

FIG. 12 is a flowchart providing an exemplary method for processing a response object list.

DESCRIPTION OF THE EMBODIMENTS

Reference will now be made in detail to the exemplary embodiments implemented according to the invention, the examples of which are illustrated in the accompanying drawings. Wherever possible, the same reference numbers will be used throughout the drawings to refer to the same or like parts.

Figure 1:
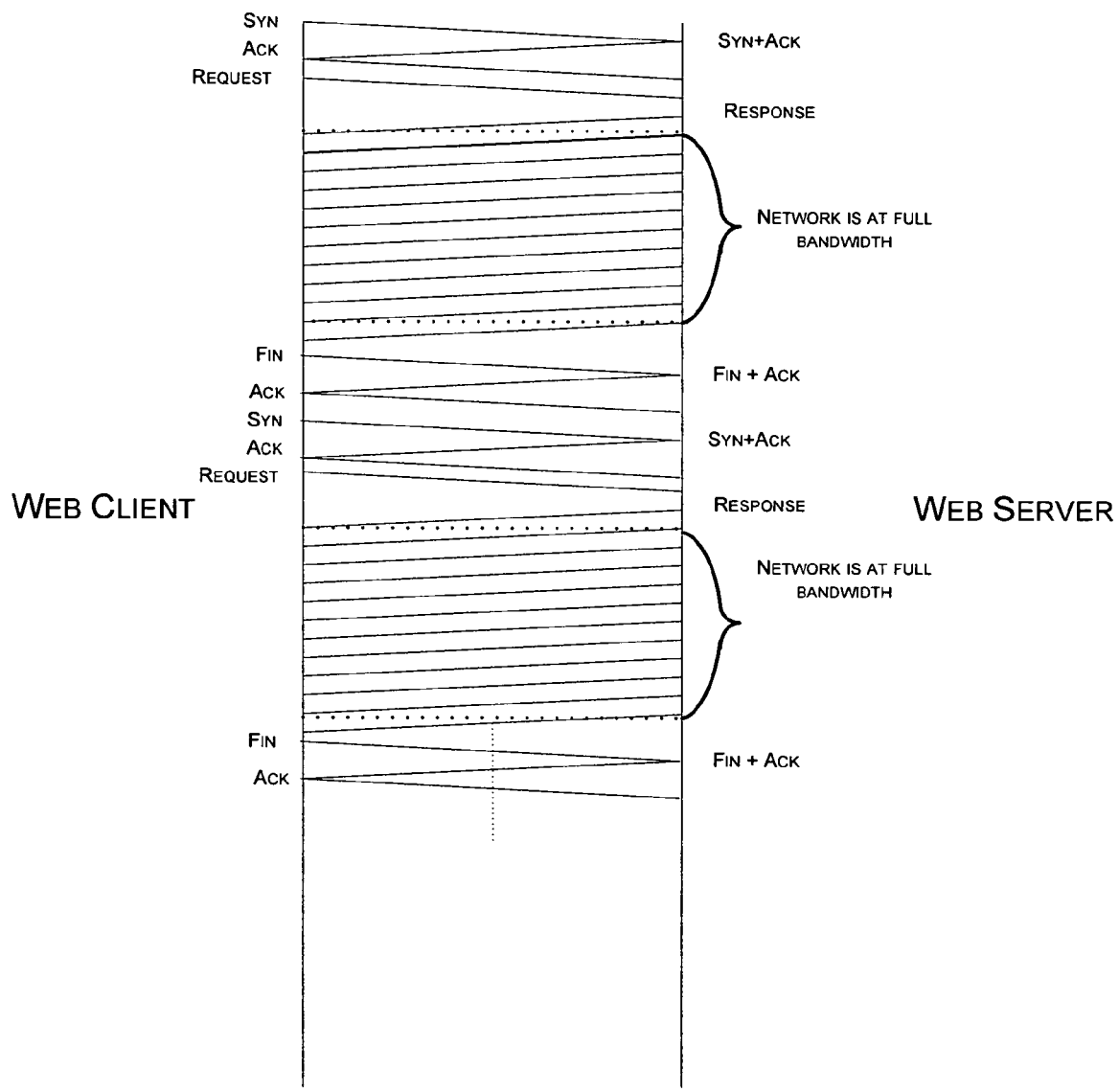
FIG. 1 illustrates the retrieval sequence for objects on a bandwidth constrained network using HTTP over TCP/IP.
Figure 2:
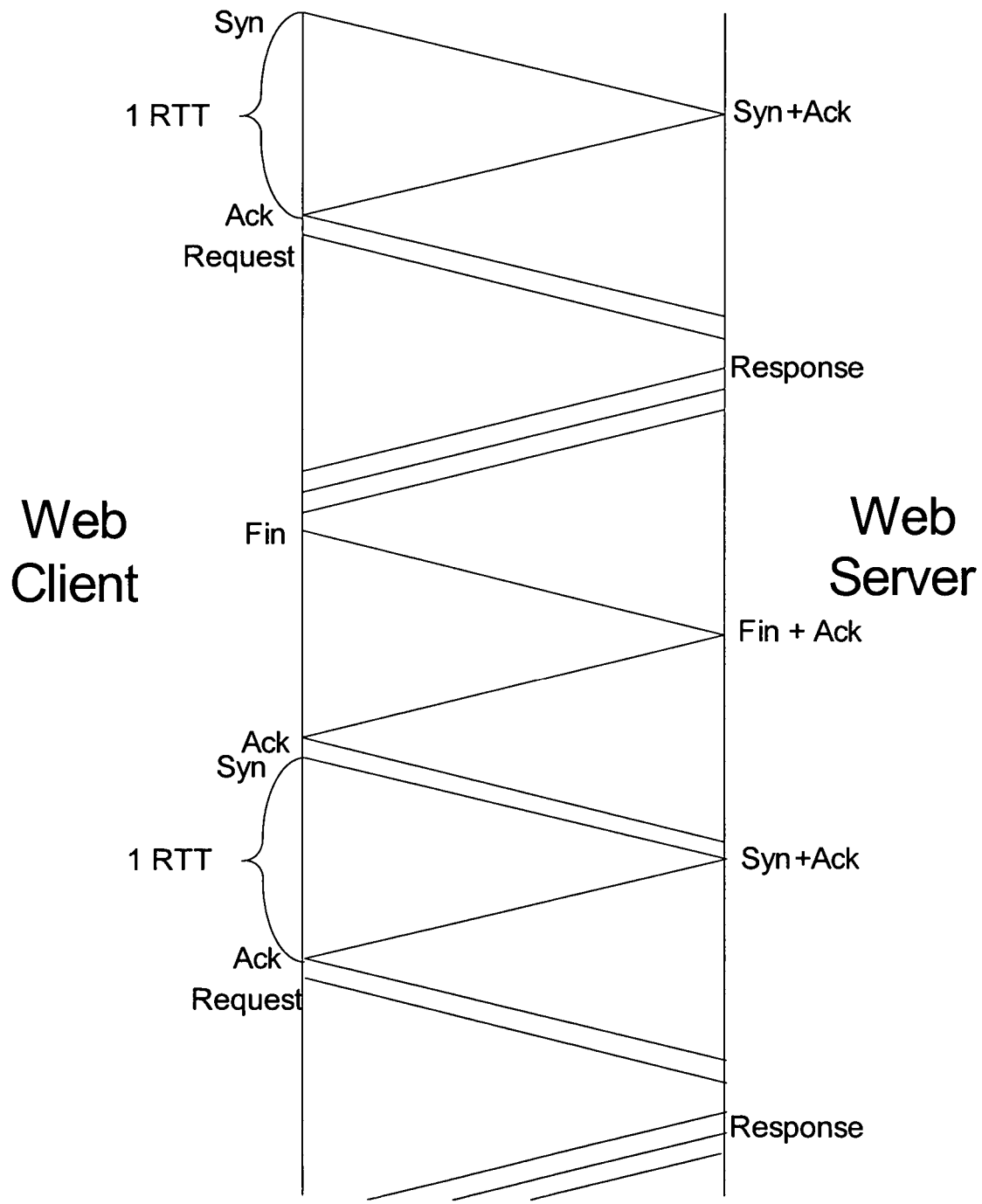
FIG. 2 illustrates the retrieval sequence for objects on a latency constrained network using HTTP over TCP/IP.
Figure 3:
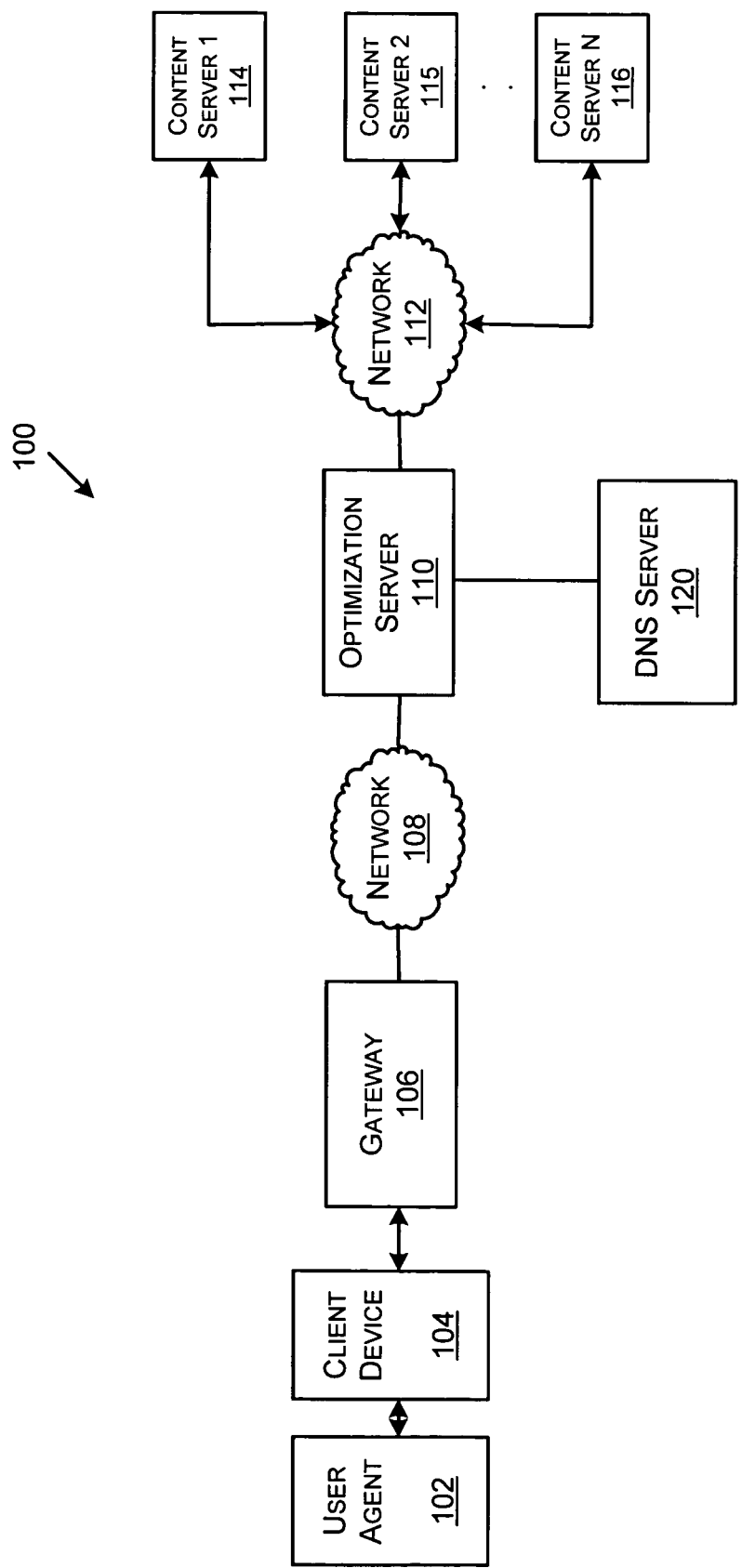
FIG. 3 is a block diagram of an exemplary system.

FIG. 3 is a block diagram of an exemplary system. Exemplary system 100 can be any type of system that transmits data over a network. For example, the exemplary system can include a browser accessing information from content servers through the Internet. The exemplary system can include, among other things, a user agent 102, a client device 104, a gateway 106, one or more networks 108, 112, an optimization server 110, one or more content servers 114-116, and a DNS server 120.

User agent 102 is a client application used with a network protocol. For example, user agent 102 could be a web browser, a search engine crawler, a screen reader, or a Braille browser, and the user agent 102 could be used to access the Internet. User agent 102 can be a software program that transmits request data (e.g., an HTTP/WAP request data) to a web server and receives response data in response to the request data. For example, user agent 102 can send request data to the content servers 114-116 for a particular file or object data of a web page identified by a URL, and the content server of the web page can query the object data in a database and can send back the object data as part of the response data (e.g., HTTP/WAP response data) to the user agent. This process continues until every object in the web page has been downloaded to the user agent.

Client device 104 is a computer program or terminal that can access remote services. Client device 104 can receive request data from the user agent 102, can transmit the request data to the content servers, and can receive response data in response to the request data. For example, the client device 104 can be Bytemobile Optimization Client Software. Client device's functionality is further described below. In some embodiments, user agent 102 and client device 104 can be housed in the same device, such as a computer, a PDA, a cell phone, a laptop, or any device accessing the Internet. Furthermore, client device 104 can be embedded within user agent 102.

Gateway 106 is a device that converts formatted data provided in one type of network to a particular format required for another type of network. Gateway 106, for example, may be a server, a router, a firewall server, a host, or a proxy server. The gateway 106 has the ability to transform the signals received from client device 104 into a signal that network 108 can understand and vice versa.

Networks 108 and 112 can include any combination of wide area networks (WANs), local area networks (LANs), or wireless networks suitable for networking communication such as Internet communication.

Optimization server (OS) 110 is a server that provides communication between gateway 106 and content servers 114-116. For example, OS 110 could be a Bytemobile Optimization Services Node. OS 110 can optimize performance by enabling significantly faster and more reliable service to customers. OS's 110 can include optimization techniques, which are further described below.

Content servers 114-116 are servers that receive the request data from the user agent 102, processes the request data accordingly, and return the response data back to the user agent 102. For example, content servers 114-116 can be a web server, an enterprise server, or any other type of server. Content servers 114-116 can be a computer or a computer program that is responsible for accepting HTTP requests from the user agent and serving the user agents with HTTP responses.

Domain Name System (DNS) server 120 is a server that associates many types of information to domain names. DNS server 120 maps the fully qualified domain name (FQDN) of a URL to the IP address associated with the FQDN. For example, DNS server 120 makes it possible to attach hard-to-remember IP addresses (such as 209.10.233.130) to easy-to-remember domain names (such as "bytemobile.com."). DNS server 120 can also list mail exchange servers accepting e-mail for each domain.

Figure 4:
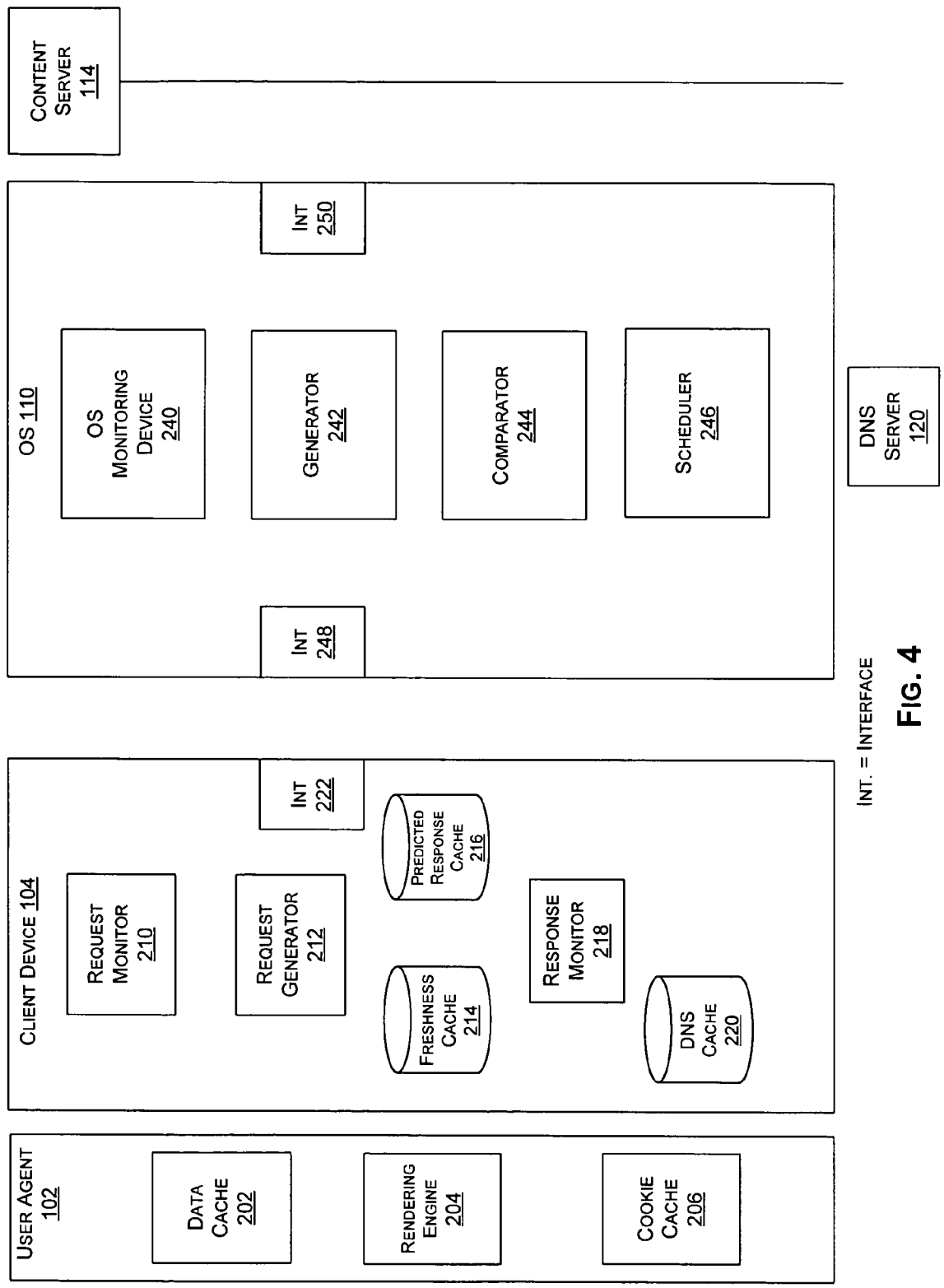
FIG. 4 is a block diagram illustrating an embodiment of the exemplary system of FIG. 1.

FIG. 4 is a block diagram illustrating an embodiment of the exemplary system of FIG. 3. User agent 102 may include, among other things, a data cache 202, rendering engine 204, and a cookie cache 206.

Data cache 202 is a storage device that stores web documents to reduce bandwidth usage and web page access times. Data cache 202 stores copies of object data requested and received by the user. Subsequent web page requests may be satisfied by accessing the data cache 202 if certain conditions are met. Such conditions may include whether the object data is located in the data cache 202 and whether the object data is deemed fresh or stale. For example, the freshness of the object data can be defined by the definition of 'fresh' and 'stale' in RFC 1945 and RFC 2616.

Rendering engine 204 can be a software application that enables a user agent to display and interact with text, images, and other information located on a webpage. When a user types in a web address or URL into the user agent 102, the rendering engine 204 uses Hypertext Transfer Protocol (HTTP) to initiate the request with the content server, e.g., content server 114. Although rendering engines can be used to access the Internet, they can also be used to access data provided by web servers in private networks or content in file systems.

Cookie cache 206 is a device that stores data relating to cookies. In some embodiments, cookie cache 206 is located on the hard drive on the client device that the user agent runs. Cookie cache can include cookies, which can include, among other things, user IDs, passwords, preference data, etc.

Client device 104 may include, among other things, a request monitor 210, a request generator 212, a freshness cache 214, a predicted response cache 216, a response monitor 218, a DNS cache 220, and an interface 222.

Request monitor 210 can be a software program or a hardware device that receives or intercepts the request data, such as an HTTP request, from the rendering engine 204. Request monitor 210 can identify the embedded request object data (e.g., embedded URLs) located with the request data and create a request object list that includes the request object data, the freshness data of the request object data, FQDN of the request object data, and/or any cookie data associated with the request object data. Request monitor 210 has the ability to communicate with user agent 102 to determine whether the request object data and any cookie data associated with the request object data are stored in the user agent 102 and if so, whether the request object data is fresh or stale. Request monitor 210 has the ability to forward to OS 110 the request data and, if available, the request object list.

Request generator 212 can be a software program or a hardware device that constructs predicted request data. Request generator 212 constructs predicted request data by accumulating object data, mapping data linking the FQDN of the object data to an IP address of the FQDN, and cookie data associated with the object data. This allows request generator 212 to mimic, as closely as possible, subsequent request data. Furthermore, request generator 212 may use a user agent string and other request data headers to help mimic the subsequent request data. In some embodiments, request generator 212 flags the predicted request data to indicate that it is a predicted request and not an original request. Request generator 212 has the ability to forward the predicted request data through OS 110 to content servers 114-116.

Freshness cache 214 is a device that stores the freshness data of object data that the user agent has determined to be stale. For example, freshness cache 214 can be a list, an array, a database, a cache, etc. When the client device 104 receives request data from the user agent and the request data includes request object data that is stale, the freshness cache 214 can be accessed to determine whether that stale object data is actually fresh. If the stale object data is indeed fresh, client device 104 can inform the user agent that the object data stored in the data cache 202 is fresh. Freshness cache 214 receives freshness data from response monitor 218 when optimized data includes the freshness data.

Predicted response cache 216 is a storage device that stores for a configurable amount of time predicted response data and stored predicted request data that identifies the predicted response data. Predicted response cache 216 can provide predicted response data to the request monitor if the request data for a particular web page from the user agent 102 matches a stored predicted request data identifying the predicted response data stored at the predicted response cache 216. This stored predicted request data can be matched to request data received by the request monitor 210 and acts as a cross reference to the predicted store data. For example, the predicted response cache can receive request object data, cookie data of the request object data, data cache parameters, and the user agent making the request to determine whether the request data matches the stored request data identifying the predicted response data. After a configurable amount of time has elapsed, the predicted response cache 216 can discard portions of the unused predicted response data and the stored predicted request data. Predicted response cache 216 receives response data corresponding to a stale request object data from response monitor 218 when optimized data includes this response data.

Response monitor 218 can be a software program or a hardware device that receives optimized data from the OS 110. The optimized data can include, among other things, response data received from a content server, response object list providing response object data, any mapping data, any freshness data for a request object data that was marked as stale and verified by the content server to be fresh ("fresh" stale object data), and/or response data corresponding to a stale request object data. After receiving the optimized data, the response monitor 218 separates the optimized data and processes the separated data accordingly. Response monitor 218 is communicatively coupled to DNS cache 220, freshness cache 214, predicted response cache 216, and user agent 102.

DNS cache 220 is a data storage device that stores mapping data linking the FQDN of the object data to an IP address of the FQDN. DNS cache 220 receives mapping data from response monitor 218 when the optimized data includes the mapping data. Additionally, DNS cache 220 allows client device 104 and user agent 102 the ability to map the FQDN of the URL to the IP address without having to access the DNS server 120. By providing mapping data to the response monitor 218, the mapping data assists the request generator 212 in constructing the request.

Interface 222 is a software program or a hardware device that communicatively couples the client device 104 to the communication means (e.g., wireless and/or wired) connecting the client device 104 and the OS 110. Interface 222 is configured to receive the request data from the request monitor, translate the request data, and transmit the translated request data to the OS 110. Further, interface 222 is configured to receive information from the communication means connecting the client device 104 and the OS 110. In some embodiments, the interface 222 can include encryption means and/or decryption means to encrypt communication leaving from and decrypt communication coming into client device 104.

Optimization server (OS) 110 may include, among other things, an OS monitoring device 240, a generator 242, a comparator 244, a scheduler 246, and a plurality of interfaces 248 and 250.

OS monitoring device 240 is a software program or a hardware device that monitors the request data received through the interface 248 from the client device 104. In some embodiments, the request data may include additional appended data, such as the request object list identifying request object data, the freshness data of the request object data, and any cookie data associated with the request object data. In some embodiments, the request object list includes the object data, the freshness data and the cookie data. When the OS monitoring device 240 receives the request data, the OS monitoring device 240 can extract any appended data from the request data and transmit the original request data from the user agent through interface 250 to the content server 114. OS monitoring device 240 can provide the extracted appended data to comparator 244.

Generator 242 is a software program or a hardware device that receives the response data from content server 114. Generator 242 can analyze the response data and determine if the response data contains references to embedded response object data that user agent 102 would have to download. For example, a GIF image would not contain references to other content data for a rendering engine to download, while a markup language (e.g., WML, HTML, XHTML, etc) can have references to other response object data that rendering engine 204 would have to download. Generator 242 could then have the ability to generate a response object list that identifies the response object data and the FQDN of the response object data.

Comparator 244 is a software program or a hardware device that receives request object list from OS monitoring device 240 and response object list from generator 242 and compares them. An exemplary comparing method is further described below in FIG. 11. Based on the comparison, the comparator 244 can update the response object list. After the comparison, the comparator 244 can transmit optimized data, which can include, among other things, response data received from the content server, response object list providing response object data, any mapping data, any freshness data for a request object data that was marked as stale and verified by the content server to be fresh ("fresh" stale object data), and/or response data corresponding to a stale request object data.

Scheduler 246 is a software program or a hardware device that receives a response data and/or predicted response data from content server and schedules the response data back to the client device 104. For example, the scheduler 246 may give preferences to response data over predicted response data from the request generator 212. Another example may include the scheduler 246 giving preference to object data appearing earlier in the response data over object data appearing later in the response data.

Interfaces 248 and 250 are similar to interface 222 of the client device 104. Each interface has the ability to communicate with the elements of the optimization server, translate the communication so that the communication means can utilize the data, and transmit the translated communication across the corresponding communication means. Like interface 222, interfaces 248 and 250 may have encryption and decryption means.

Figure 5:
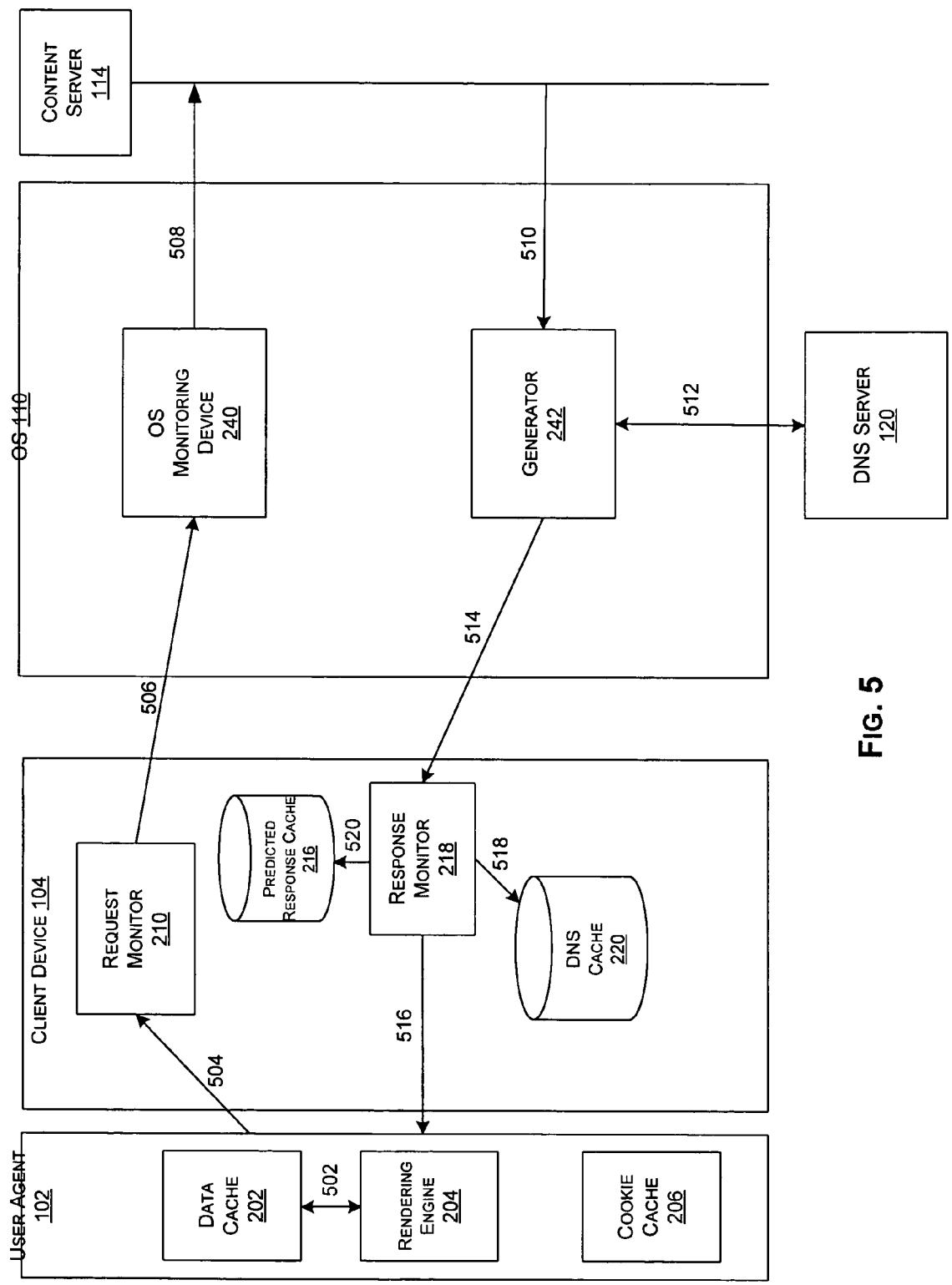
FIG. 5 is a functional diagram illustrating an exemplary communication flow in the exemplary system of FIG. 4.

FIG. 5 is a functional diagram illustrating an exemplary communication flow in the system of FIG. 4. It is assumed for the purposes of explaining this exemplary communication flow that when a web page is first requested by the rendering engine 204, the HTML content data of the web page does not reside in a data cache 202 of the user agent 102 although other components of the web page may reside in the data cache 202. In addition, while a single content server 114 has been displayed for simplicity purposes, any number of content servers could be provided. The user inputs a URL into a user agent 102. Rendering engine 204 queries (502) the data cache 202 for any content data relating to the URL and, under the assumed conditions, data cache 202 does not return any content data to rendering engine 204. In some embodiments, rendering engine 204 can also query cookie cache 206 for any cookie data associated with the URL.

After the query, the rendering engine 204 transmits (504) the request data (e.g., HTTP request of the URL) to the content server 114. The request monitor 210 at the client device 104 can receive or intercept the request data. Alternatively, in some embodiments, the user agent 102 can send the request data over a wireless link. The request monitor 210 forwards (506) the request data to the OS 110. The request data can be directed explicitly to a gateway or proxy and then to the OS 110, or it can be directed to the content server 114 and the request can be intercepted transparently by an inline proxy or gateway. The OS 110 analyzes the request data and determines whether the request is transmitted from either a user agent (e.g., user agent 102) or a client device (e.g., client device 104) that contains the client hardware/software understanding the prediction protocol. As in this case, the OS 110 determines that the client device 104 has the capabilities and forwards (508) the request data to the appropriate content server 114. Consequently, the content server 114 provides (510) response data (e.g., HTTP response of the requested URL) associated with the request data to the generator 242 of the OS 110.

After the generator 242 has received the response data, generator 242 analyzes the response data to determine if the response data includes references to embedded response object data (e.g., embedded URLs within the HTTP response) that the rendering engine 204 would have to download. For example, a GIF image might be compressible by the proxy, but it does not contain references to other content that a web browser would have to download, while a markup language can have references to other response object data that the web browser would have to download. The generator 242 can parse through the response data and create a response object list that identifies embedded response object data within the response data. For example, the response object list can include the URL response data and the embedded URL data. In some embodiments, the identification of the embedded response object data can be dependent upon the capabilities of the user agent 102 and/or client device 104.

When the response object data is a URL, generator 242 can analyze the URL to determine if the URL includes a fully qualified domain name (FQDN) different from an FQDN associated with the URL of the request data The FQDN associated with the URL of the request data is copied by the OS 110 prior to transmitting the request data to content server 114. In this exemplary embodiment, the FQDN of the URL is different and, consequently, the generator 242 queries (512) the DNS server 120. The generator 242 transmits the different FQDN to the DNS server 120 and the DNS server 120 returns mapping data associated with the different FQDN to the generator 242. The mapping data (e.g., IP address) maps the different FQDN to the IP address associated with the different FQDN.

After the generator 242 has received the mapping data from the DNS server 120, generator 242 forwards (514) optimized data to the client device 104. In this exemplary embodiment, the optimized data can include, among other things, the response data, the response object list identifying the response object data, and the mapping data associated with the response object data. The response monitor 218 of the client device 104 receives the optimized data and separates the optimized data into the response data, the response object list, and the mapping data.

After the optimized data has been separated, the response monitor 218 can transmit (516) the response data to the rendering engine 204 of the user agent 102 so that a user can view the web page that was originally requested. Further, the response monitor 218 transmits (518) the mapping data to the DNS cache 220 wherein the DNS cache stores the mapping data for a configurable amount of time. When the user agent 102 requests the mapping data corresponding to an FQDN of the object data, the client device 104 can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120.

Figure 7:
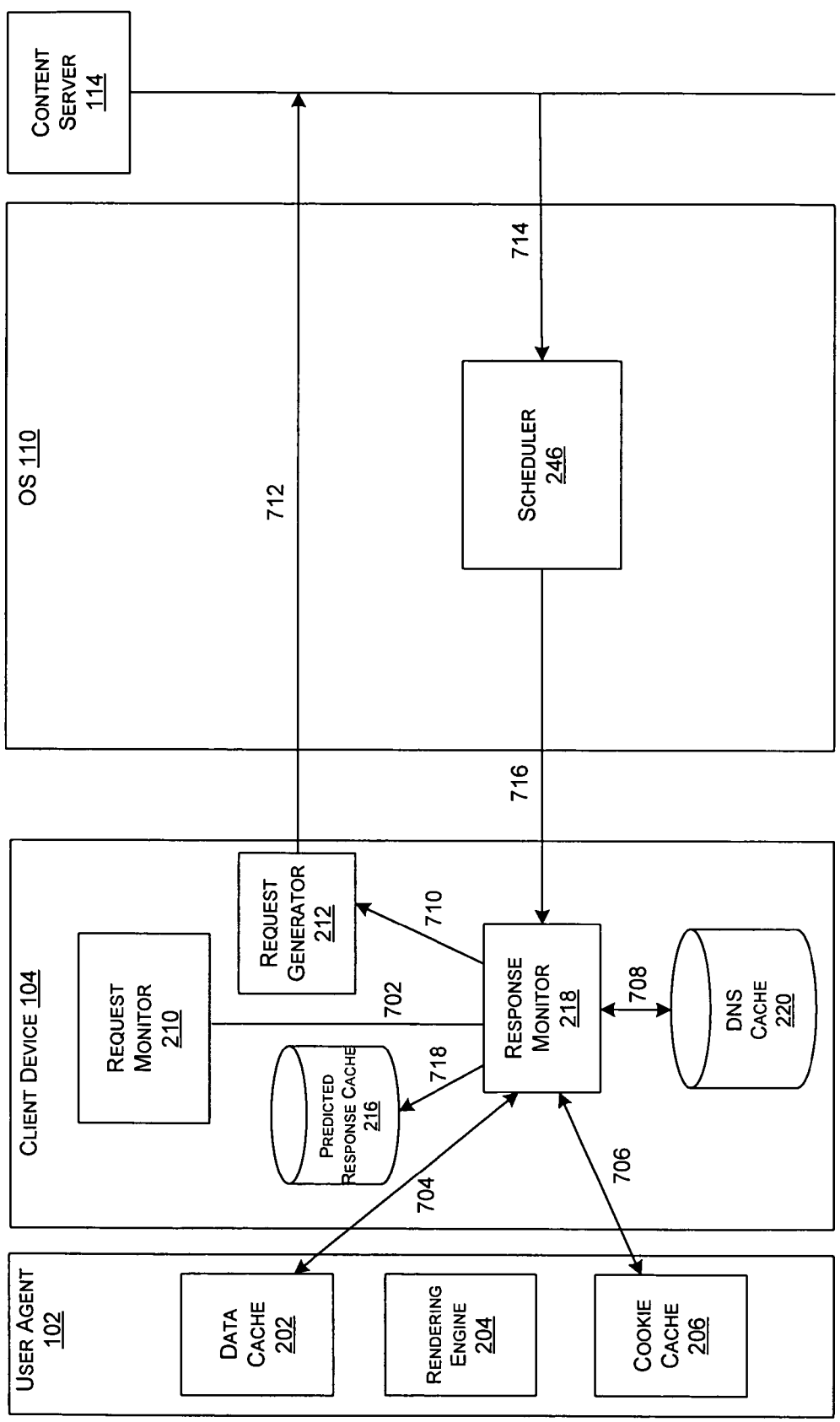
FIG. 7 is a functional diagram illustrating an exemplary method for processing object data in the response object list.

Additionally, the response monitor 218 can process the response object list by storing (520) a predicted response data and predicted request data identifying the predicted response data in the predicted response cache 216. Regarding the predicted response data, once a request monitor receives a subsequent request from a user agent, the request monitor can query the predicted response cache 216 for any predicted response data that corresponds to the subsequent request and forward the predicted response data to the user agent without having to query the content server with the subsequent request data. The processing of the response object list can be the exemplary processing method illustrated in FIG. 7 as now explained. The response monitor 218 can determine whether the response object data (e.g., embedded URLs of the requested URL, etc.) is currently being downloaded per a user agent request or due to another client object prediction by contacting (702) the request monitor. The request monitor 210 can determine which response object data is outstanding because all request data is transmitted through it. In some embodiments, request monitor 210 check the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache (not shown) about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache 202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data (e.g., embedded URLs within the response object list that have yet to be downloaded from content server) along with any existing cookie and mapping data associated with the response object data to request generator 212. Request generator 212 uses the response object data along with any existing cookie and mapping data associated with the response object data to mimic an HTTP request from the user agent. Further, the request generator 212 can generate a user agent string and other HTTP request headers to mimic, as closely as possible, what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 receives the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g., URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 6:
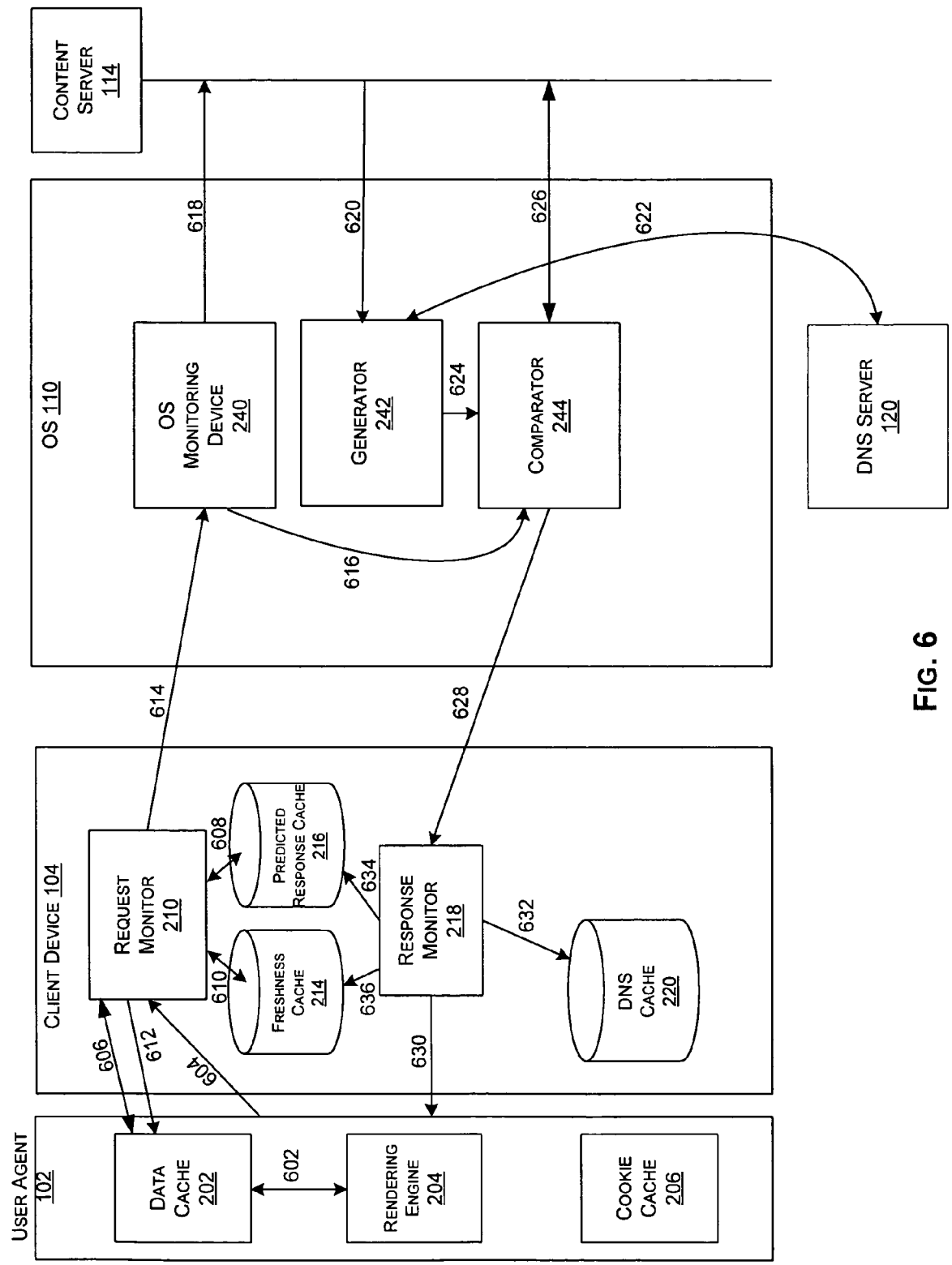
FIG. 6 is a functional diagram illustrating an exemplary communication flow in the exemplary system of FIG. 4.

FIG. 6 is a functional diagram illustrating an exemplary communication flow in the system of FIG. 4. It is assumed for the purposes of explaining this exemplary communication flow that when a web page is first requested by the rendering engine 204, some of the HTML content data of the web page resides in the data cache 202 of the user agent 102 and the stored HTML content data is stale. In addition, while a single content server 114 has been displayed for simplicity purposes, any number of content servers could be provided. A user inputs a URL into a user agent 102. The user agent passes this request to the rendering engine 204. Rendering engine 204 queries (602) the data cache 202 for any content data relating to the URL and the data cache 202 determines that at least some of the content data is stale. In some embodiments, rendering engine 204 can also query cookie cache 206 and append any retrieved data to the request. The user agent 102 transmits (604) the request data to the client device 104.

After the client device 104 has received the request data (e.g., HTTP request of the URL), the request monitor 210 queries (606) the data cache 202 of the user agent 102. In some embodiments, request monitor 210 does not query the data cache 202 because user agent 102 has provided the embedded request object data along with the request data. Based on the query, the request monitor generates a request object list that identifies embedded request object data within the request data. In some embodiments, request monitor 210 can further query data cache 202 and cookie cache 206 for any freshness data and cookie data associated with the request object data. The freshness and cookie data can be provided in the request object list. The identification of the request object data can be dependent on the client device 104 and the user agent 102. For example, while some user agents display all request object data of a web page, other user agents try to intelligently render the web page onto a small screen. This intelligent rendering may only download a subset of embedded request object data within the webpage. Consequently, the parsing performed may consider these intelligent rendering techniques for each client device and each user agent.

Request monitor 210 queries (608) the predicted response cache 216 to determine if the request object data that is to be downloaded matches any stored predicted request data that identifies the predicted response data. For example, the request monitor 210 can send to the predicted response cache 216, among other things, URL data, cookie data, cache parameter data, and user agent data. If any stored predicted request data matches this sent data, the predicted response cache 216 can transmit back to the request monitor 210 the predicted response data that has been identified by the matched stored predicted request data.

Additionally, the request monitor 210 can query (610) the freshness cache 214 for any freshness data concerning stale request object data to determine if any stale object data listed on the request object list is in fact "fresh" stale object data. For example, request monitor 210 has a URL listed as being stale and forwards at least the URL data to the freshness cache 214 and the freshness data provides to the request monitor 210 any updated freshness data for that particular URL. If the predicted response cache 216 or the freshness cache provides any predicted response data or updated freshness data, the request object list can be updated with this data and the response monitor 210 can forward (612) the predicted response data and/or updated freshness data to the data cache 202 of the user agent 102. The data cache 202 can be updated with the updated freshness data and/or the predicted response data.

If the request object list includes any request object data marked to be downloaded, the request monitor 210 can forward (614) the request data to the OS 110. The request data may include the request object list from the request monitor 210.

OS monitoring device 240 of the OS 110 receives the request data from the client device, analyzes the request data, and determines whether the request data has been transmitted from either a user agent (e.g., user agent 102) or a client device (e.g., client device 104) that contains the client hardware/software having the necessary capabilities. Furthermore, if the request object list has been appended to the request data, OS monitoring device 240 can extract the request object list from the response data and forward (616) the request object list to comparator 244. OS monitoring device 240 can forward (618) the request data (without the appended data) to the appropriate content server 114. Consequently, the content server 114 provides (620) response data associated with the request data to the generator 242 of the OS 110.

After generator 242 has received the response data, generator 242 analyzes the response data to determine if the response data includes references to embedded response object data that the rendering engine 204 would have to download. For example, a GIF image might be compressible by the proxy, but it does not contain references to other object data that a web browser would have to download, while a markup language can have references to other object data that the web browser would have to download. The generator 242 can parse through the response data and can create a response object list identifying the request object data and the FQDN of the request object data. In some embodiments, the identification of the embedded object data can be dependent upon the capabilities of the user agent 102 and/or client device 104.

When the response object data is a URL, generator 242 can analyze the URL to determine if the URL includes an FQDN different from the FQDN associated with the URL provided in the request object list. The FQDN associated with the URL of the request object list is copied by the OS 110 and provided to generator 242 prior to transmitting the request data to content server 114. In this exemplary embodiment, the FQDN is different and, consequently, the generator 242 queries (622) the DNS server 120. Generator 242 transmits the different FQDN to DNS server 120 and DNS server 120 returns the corresponding mapping data to generator 242. The mapping data maps the different FQDN to the IP address associated with the different FQDN.

After the generator 242 has received any existing mapping data, generator 242 can forward (624) the response data, the mapping data, and the response object list to the comparator 244. Comparator 244 compares each request object data on the request object list with each response object data on the response object list. If the response object data matches the request object data and the matched request object data is fresh, the comparator 244 can delete the response object data from the response object list because the response object data is not to be downloaded. Alternatively, in some embodiments, the response object data from the response object list can be marked as not being downloaded instead of being deleted from the response object list. If the response object data does not have a corresponding match in the request object list, comparator 244 can update the response object list to include information that this particular response object data is to downloaded. If the response object data matches the request object data and the matched request object data is stale, the comparator 244 can determine if the request object data is truly stale by requesting the content server to verify the freshness of the request object data. The response data from content server 114 has the ability to inform comparator 244 if the content is stale, by either responding with new object data or by informing the comparator 244 that the current version is fresh. Comparator 244 transmits the request for verification along with the current "timestamp" of the object data to content server 114 so that the content server 114 can compare the timestamp information. If the content server verifies that the request object data is stale, comparator 244 can update the response object list to include information that this particular response object data is to be downloaded. If the content server verifies that the alleged stale request object data is indeed fresh ("fresh" stale object data), comparator 244 can update the response object list to include information that this particular response data object is not to be downloaded. Comparator 244 updates the response object list based on each request object data.

After the comparator has updated the response object list, comparator 244 can query (626) the content server by providing the response object data and receiving response data of the response object data that is to be downloaded to user agent 102. The comparator 244 forwards (628) optimized data to the client device 104. In this exemplary embodiment, the optimized data can include, among other things, the response data from content server 114, the response object list, the mapping data, the response data associated with the response object data to be downloaded to user agent, and the freshness data of the "fresh" stale content data. In some embodiments, comparator can transmit each group separately.

The response monitor 218 of the client device 104 receives the optimized data, separates the optimized data, and processes the separated data accordingly. The optimized data is separated into the response data, the response object list, the mapping data, the response data associated with the response object data to be downloaded to user agent, and the freshness data of the "fresh" stale content data.

After the optimized data has been separated, the response monitor 218 transmits (630) the response data to the user agent 102, which can store the response data and/or upload the response data into rendering engine 204. Further, the response monitor 218 transmits (632) the mapping data to DNS cache 220, which stores the mapping data for a configurable amount of time. When user agent 162 requests an FQDN, client device 104 or the user agent itself can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120. Furthermore, the response monitor 218 forwards (634) the response data corresponding to the request object data to predicted response cache 216 so that this response data can be stored for a configurable amount of time. When the user agent determines that additional embedded data corresponding to the URL response is needed from content server to complete the web page at user agent, user agent can transmit a subsequent request requesting response data corresponding to the request object data. Because the client device has this response data corresponding to the request object data (predicted response data), the client device can provide the predicted response data to the user agent without having to access the content server for this subsequent request. Also, the response monitor 218 processes the freshness data of the "fresh" stale object data by forwarding (636) the freshness data to freshness cache 214. Alternatively, in some embodiments, the freshness data can be forwarded to data cache 202 of the user agent 102 to instruct the data cache 202 that the stale object data of the content data is indeed fresh.

Additionally, the response monitor 218 can process the response object list. Regarding the predicted response data, once a client device receives a subsequent request from a user agent, the client device can query the predicted response cache 216 for any predicted response data that corresponds to the subsequent request and forwards the predicted response data to the user agent without having to query the content server with the subsequent request data. The processing of the response object list can be the processing method illustrated in FIG. 7. The response monitor 218 can determine whether the response object data (e.g., URL, etc.) is currently being downloaded per a user agent request or due to another client object prediction by contacting (702) the request monitor. The request monitor 210 can determine which response object data is outstanding because all request data is transmitted through it. In some embodiments, request monitor 210 checks the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache 202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data along with any existing cookie and mapping data associated with the response object data as well as freshness data to request generator 212. Request generator 212 uses the response object data along with any existing cookie and mapping data associated with the response object data to mimic an HTTP request from the user agent. Further, the request generator 212 can generate a user agent string and other HTTP request headers to mimic, as closely as possible, what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 receives the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g., URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 8:
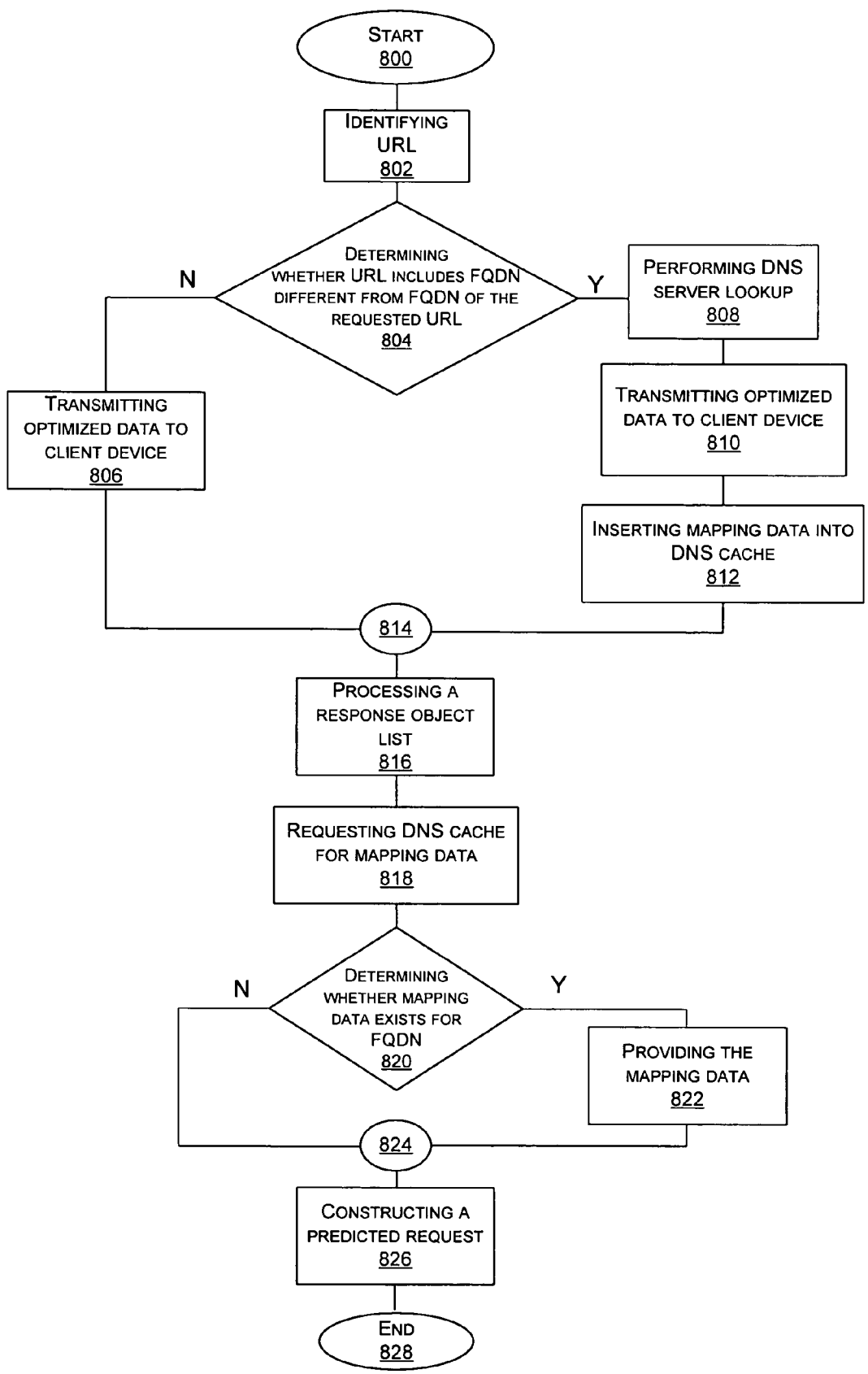
FIG. 8 is a flowchart representing an exemplary method for DNS optimization.

FIG. 8 is a flowchart representing an exemplary method for DNS optimization. It will be readily appreciated by one of ordinary skill in the art that the illustrated procedure can be altered to delete steps or further include additional steps. After initial start step 800, an OS can identify (802) URLs associated with response data from a content server and store these URLs in a response object list.

Once the OS has identified the URLs, the OS can determine (804) whether each URL includes an FQDN different from an FQDN associated with the URL of a request data. If the OS determines that the FQDN is the same, the OS transmits (806) optimized data to the client device and the method can proceed to connector 814. On the other hand, if the OS determines that at least one response URL has an FQDN different from the FQDN of the requested URL, OS performs (808) a DNS lookup from a DNS server. OS provides the FQDN data to the DNS server and the DNS server provides an IP address associated with the provided FQDN to the OS based on the FQDN data thereby creating mapping data that maps the FQDN to the IP address. In some embodiments, performing step 808 is controlled by the capabilities of a client device or the user agent. For example, the capabilities of the client device can be explicitly relayed to the OS via communication from the client device or implicitly relayed to the OS via a user agent string.

After the OS has performed the DNS lookup, the OS transmits (810) optimized data, which includes the mapping data, to the client device. In some embodiments, the mapping data can be transmitted separately from the optimized data. Once the client device receives the optimized data, the client device can extract the mapping data and insert (812) the mapping data into a DNS cache and the method can proceed to connector 814. The DNS cache can be located in the user agent or the client device.

The method proceeds from connector 814 to the client device processing (816) the response object list, which includes one or more URLs. When processing a URL on the response object list, the client device can request (818) the DNS cache for any mapping data associated with an FQDN of the particular URL. As a result, the DNS cache determines (820) whether the mapping data (e.g., IP address) exists for the FQDN of the particular URL. If the mapping data does not exist, the method proceeds to connector 824. If the mapping data exists, the DNS cache provides (822) mapping data to either the user agent or the client device and the method proceeds to connector 824.

The method proceeds from connector 824 to the client device constructing (826) a predicted request data where the construction includes, among other things, URLs and any existing mapping data, which correspond to the URLs, provided by the DNS cache. In some embodiments, the construction can also include cookie data associated with the URLs from a cookie cache of the user agent. After the constructing step 826, the method can end (828).

Figure 9A:
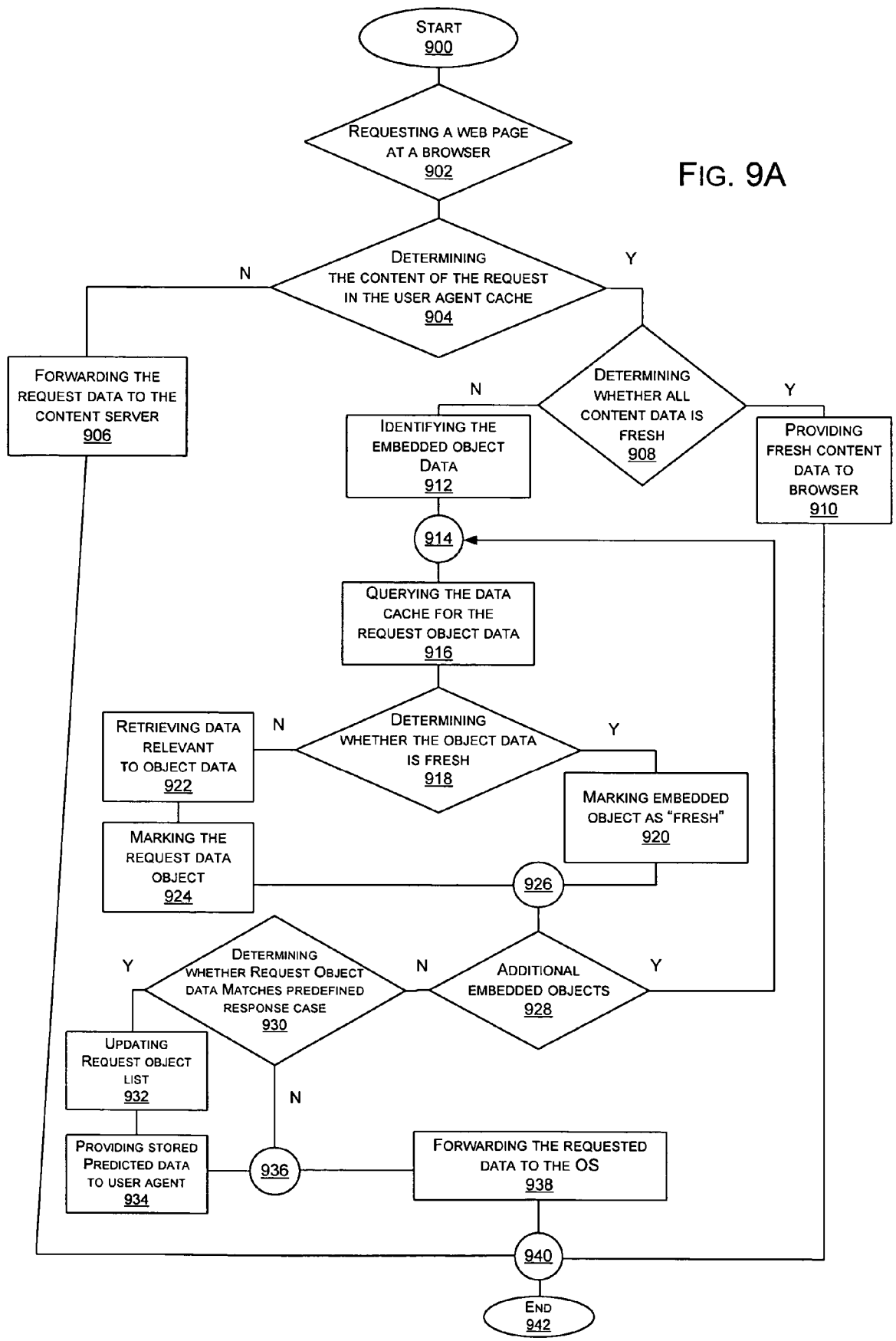
FIGS. 9A & 9B are flowcharts representing exemplary methods for providing object prediction at a user agent and a client device.
Figure 9B:
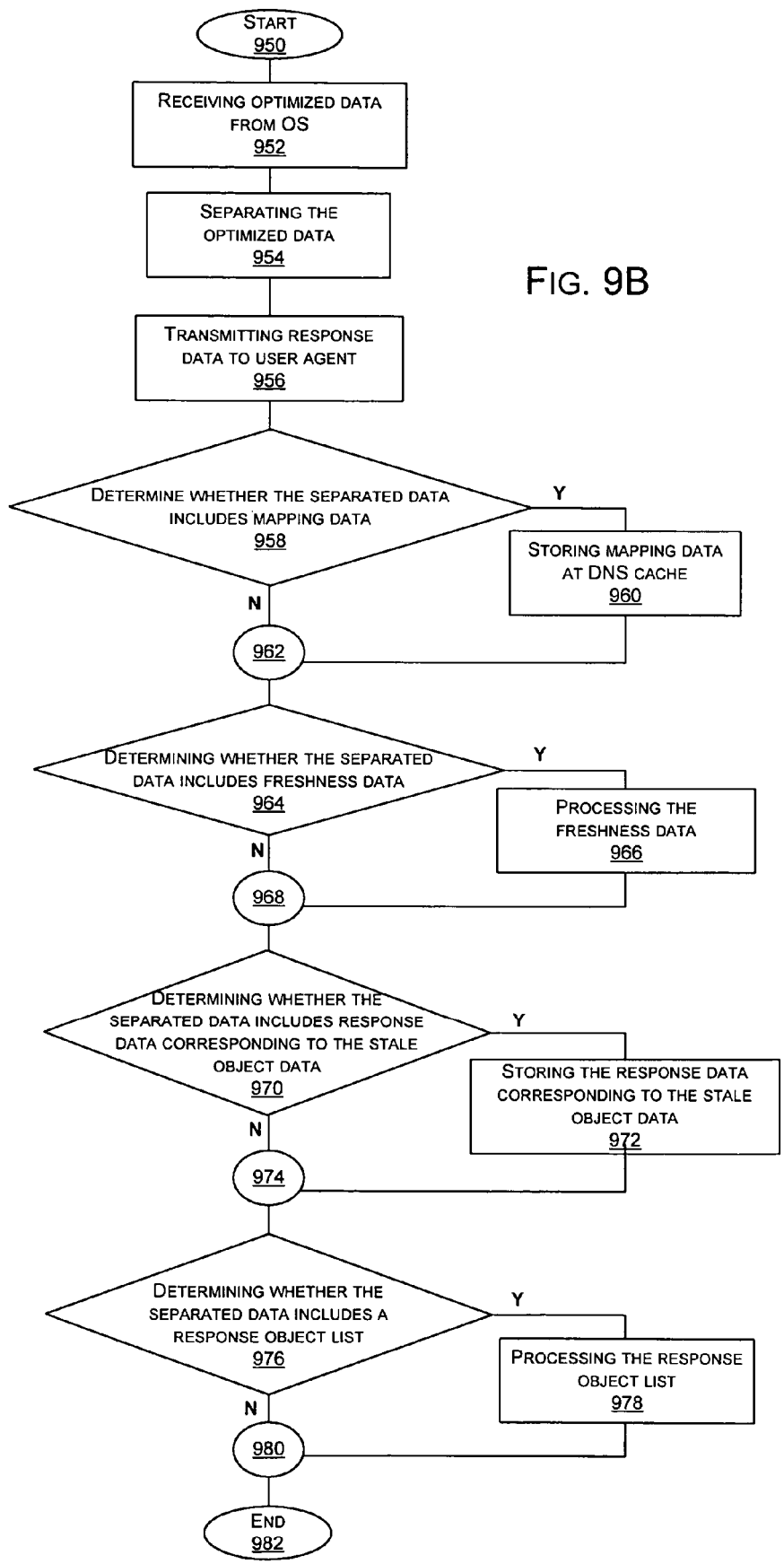

FIGS. 9A & 9B are flowcharts representing exemplary methods for providing object prediction at a user agent and a client device. Referring to FIG. 9A, it will be readily appreciated by one of ordinary skill in the art that the illustrated procedure can be altered to delete steps or further include additional steps. While the exemplary method provided in FIG. 9A is tailored more towards a client device, it is readily appreciable that the exemplary method can be performed in part or exclusively by a user agent. After initial start step 900, a user requests (902) a web page from a user agent.

After the web page has been requested, the user agent determines (904) whether the content data of the request is stored in a data cache located at the user agent. For example, the content data can be markup language content data of a requested web page wherein the markup language can be HyperText Markup Language (HTML), Extensible HTML (XHTML), Wireless Markup Language (WML), etc. If the content data is not stored, the user agent can forward (906) the request data (e.g., HTTP request of the URL), which includes the requested content data, to the content server and then proceed to connector 940. In some embodiments, the client device intercepts the request data and then forwards the request data to the content servers. On the other hand, if the content data is stored, the user agent determines (908) whether all content data is fresh or stale. If the content data is fresh, the user agent provides (910) the fresh content data to the rendering engine and the method proceeds to connector 940. If some of the content data is stale, the client device can identify (912) embedded request object data (e.g., embedded URLs within the HTTP request of URL) associated with the content data and place all identified object data on a request object list. For example, the object data can include one or more URLs.

After the identification, the client device can query (916) the data cache by providing the request object data and receiving any freshness data of the object data stored at the data cache of the user agent. The user agent can determine (918) whether the stored object data is fresh. If the stored object data is fresh, the corresponding request object data on the request object list is marked (920) as being fresh and the method proceeds to connector 926. On the other hand, if the stored object data is stale or not present at the data cache, the client device retrieves (922) any relevant data related to this object data. For example, the relevant data may include any cookie data or any freshness data associated with the object data only if the content data is in the data cache and is stale. After the retrieval of any relevant data, the corresponding request object data on the request object list is marked (924) accordingly. The request object data is marked stale if the corresponding stored object data is found to be stale or is marked to be downloaded if the stored object does not exist. After the marking, the method can proceed to connector 926.

The client device can then determine (928) whether there is any additional embedded request object data. If so, the method proceeds to connector 914. Otherwise, the method proceeds to determine (930) whether the request object data that is marked as being stale or to be downloaded on the request object list matches stored predicted request data in a predicted response cache. For example, the match can occur when the request object data, the cookie data of the request object data, the data cache parameters, and the user agent are similar or the same between the request object data and the stored predicted request data. If not, the method proceeds to connector 936. Otherwise, if a match occurs, the client device updates (932) the request object list by marking this request object data to not be downloaded. Further, the client device provides (934) to the user agent the predicted response data that has been identified by the matched stored predicted request data. In some embodiments, the stored predicted response data can include freshness and mapping data. The user agent can store this stored predicted response data in the data cache or provide it to the web browser. The method then proceeds to connector 936.

Client device can then forward (938) the request data, which can include the request object list, to the OS. The method can proceed to connector 940 and then end (942).

Referring to FIG. 9B, it will be readily appreciated by one of ordinary skill in the art that the illustrated procedure can be altered to delete steps or further include additional steps. While the exemplary method provided in FIG. 9B is tailored towards a client device, it is readily appreciable that the exemplary method can be performed in part or exclusively by a user agent. After initial start step 950, the client device receives (952) optimized data from an OS. The optimized data can include, among other things, response data associated with a request data, response object list identifying request object data, any mapping data, any freshness data of a "fresh" stale object data, and response data corresponding to a stale request object data.

After the client device has received the optimized data, the client device can separate (954) the optimized data based on the type of data included within. For example, the optimized data can be separated based on whether the data is response data provided by the content server, a response object list, any mapping data, any freshness data of the "fresh" stale object data, and response data corresponding to the stale request object data.

The client device can transmit (956) to the user agent the response data that has been provided by the content server. Further, the client device can determine (958) whether the separated optimized data includes any mapping data. If not, the method proceeds to connector 962. Otherwise, if the separated optimized data includes mapping data, the client device stores (960) the mapping data at a DNS cache within a client device for future referencing. If the user agent requests a DNS query, a client device could lookup the mapping data in the DNS cache without having to query a remote DNS server. In some embodiments, determining step 958, storing step 960, and connector 962 can be moved to any point on the flowchart as long as they are after separating step 954.

Furthermore, the client device can determine (964) whether the separated optimized data includes any freshness data. If not, the method proceeds to connector 968. Otherwise, if the separated optimized data includes freshness data, the client device processes (966) the freshness data of a "fresh" stale object data by storing this freshness data in a freshness cache for future referencing. For example, if a user agent requests object data that it has determined to be stale, the client device can perform a freshness lookup at the freshness cache and, if any freshness data corresponds to the stale request object data, the client device can inform the user agent that the stale object data is indeed fresh. In some embodiments, instead of the client device having a freshness cache, the client device can notify the user agent that the request object data is indeed fresh and the user agent can update its data cache to show that the stored object data is fresh. In some embodiments, determining step 964, processing step 966, and connector 968 can be moved to any point on the flowchart as long as they are after separating step 954.

Additionally, the client device can determine (970) whether the separated optimized data includes any response data that was downloaded because the object data was determined to be stale ("stale" response data). If not, the method proceeds to connector 974. Otherwise, if the separated optimized data includes any "stale" response data, the client device stores (972) the "stale" response data in a predicted response cache for future referencing. This "stale" response data For example, if a user agent requests object data that it has determined to be stale, the client device can perform a request data lookup at the predicted response cache by providing requested object data and, if any stored predicted request data matches the provided request object data, the predicted response cache provides predicted response data (stored "stale" response data), which cross references to the stored predicted request data, to the user agent. The user agent can display this "stale" response data at the web browser or store this "stale" response data in its data cache. In some embodiments, determining step 970, storing step 972, and connector 974 can be moved to any point on the flowchart as long as they are after separating step 954.

Also, the client device can determine (976) whether the separated optimized data includes a response object list. If not, the method can proceed to connector 980 and the method can end (982). Otherwise, if the separated optimized data includes a response object list, the client device can process (978) the response object list, such as the exemplary processing method shown below in FIG. 12. In some embodiments, determining step 976, processing step 978, and connector 980 can be moved to any point on the flowchart as long as they are after separating step 954. The method can then proceed to end (982).

For example, FIG. 12 provides an exemplary method for processing the response object list. It will be readily appreciated by one of ordinary skill in the art that the illustrated procedure can be altered to delete steps or further include additional steps. While the exemplary method provided in FIG. 12 is tailored towards a client device, it is readily appreciable that the exemplary method can be performed in part or exclusively by a user agent. After initial start step 1200, the client device determines (1204) whether the current response object data from response object list is currently being downloaded by a user agent request or another client prediction. For example, the response object list may include object data, such as URLs, and data relating to the object data such as freshness data and whether the object data needs to be downloaded. If the current response object data has been downloaded, the method proceeds to connector 1214. Otherwise, the client determines (1206) whether the response object data is located in a user agent and is marked in the user agent as being fresh. If so, the method proceeds to connector 1214.

Otherwise, if the response object data is neither located in the user agent nor is marked in the user agent as being fresh, client device queries (1208) a cookie cache for any cookie data associated with the response object data. Further, the client device queries (1210) the DNS cache for any mapping data associated with the response object data. Consequently, the client device can store (1212) any cookie or mapping data associated with the response object data.

After the client device has stored the cookie or mapping data, the client device determines (1216) whether there is any additional response object data to be processed. If so, the method proceeds to connector 1202. Otherwise, if there is no additional response object data to be processed for the response object list, the client device can construct (1218) the predicted request data that includes response object data and any cookie and mapping data related to the response object data. To try to predict a future request by a user agent, the client device tries to mimic the request as much as possible by using cookie data and mapping data. Further, the construction of the request may include mimicking a user agent string and other request header data, and/or flagging the request data as being a predicted request and not an actual request. Once the predicted request data has been constructed, the client device transmits (1220) the predicted request data to a content server.

After the client device has transmitted the predicted response data, the content server forwards the response data that is associated with the predicted request data (predicted response data), and the client device receives (1222) the predicted response data. Once the predicted response data has been received, the client device stores (1224) the predicted response data in a predicted response cache at the client device for a configurable amount of time. If the user agent requests data that is the same or is similar to the object data within the predicted response cache, the client device can return the predicted response data to the user agent, in some cases, without having to access the content servers thereby reducing bandwidth and latency. After the predicted response data has been stored, the method can end (1226).

Figure 10:
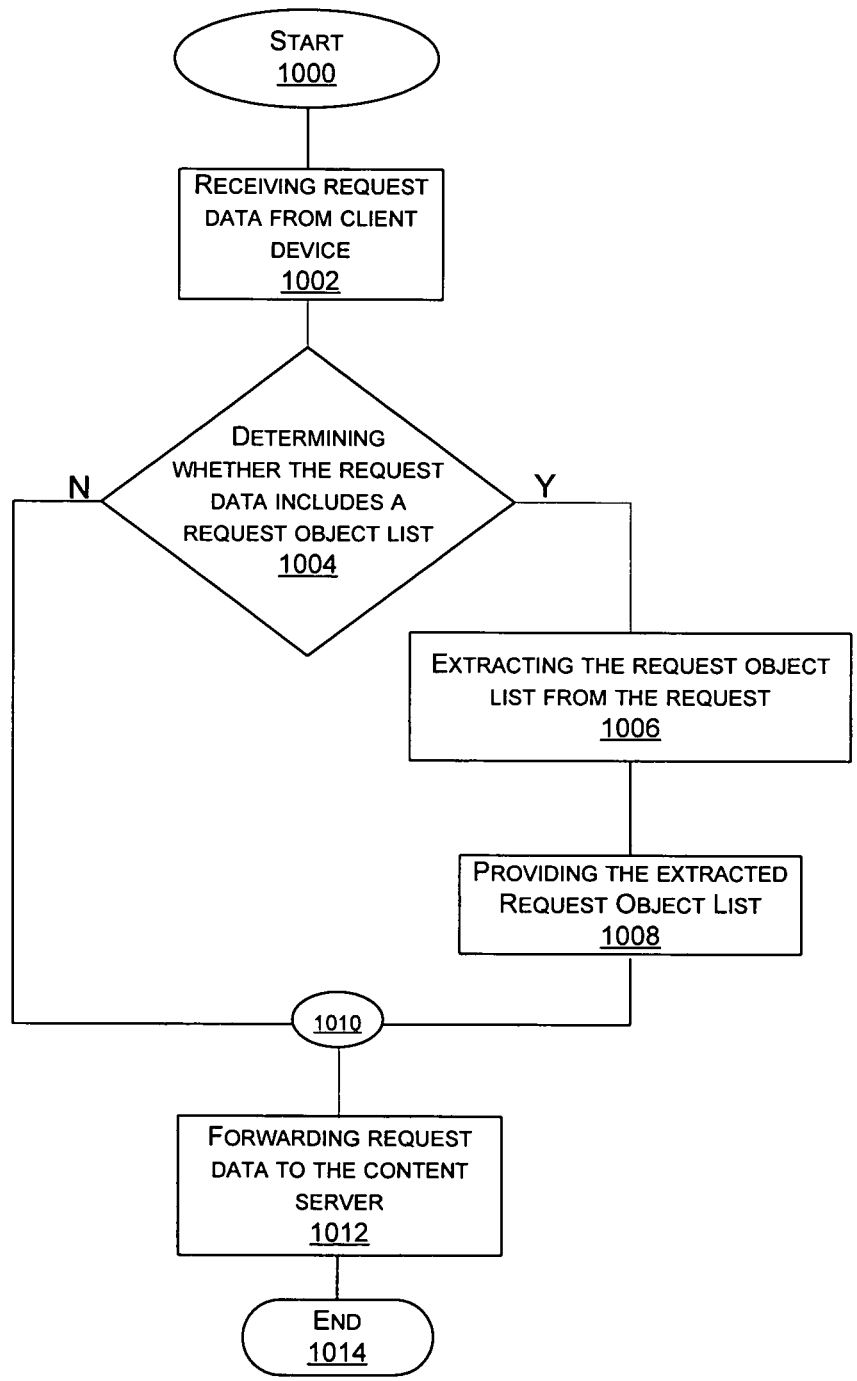
FIGS. 10 & 11 are flowcharts representing exemplary methods for providing object prediction at an optimization server.
Figure 11:
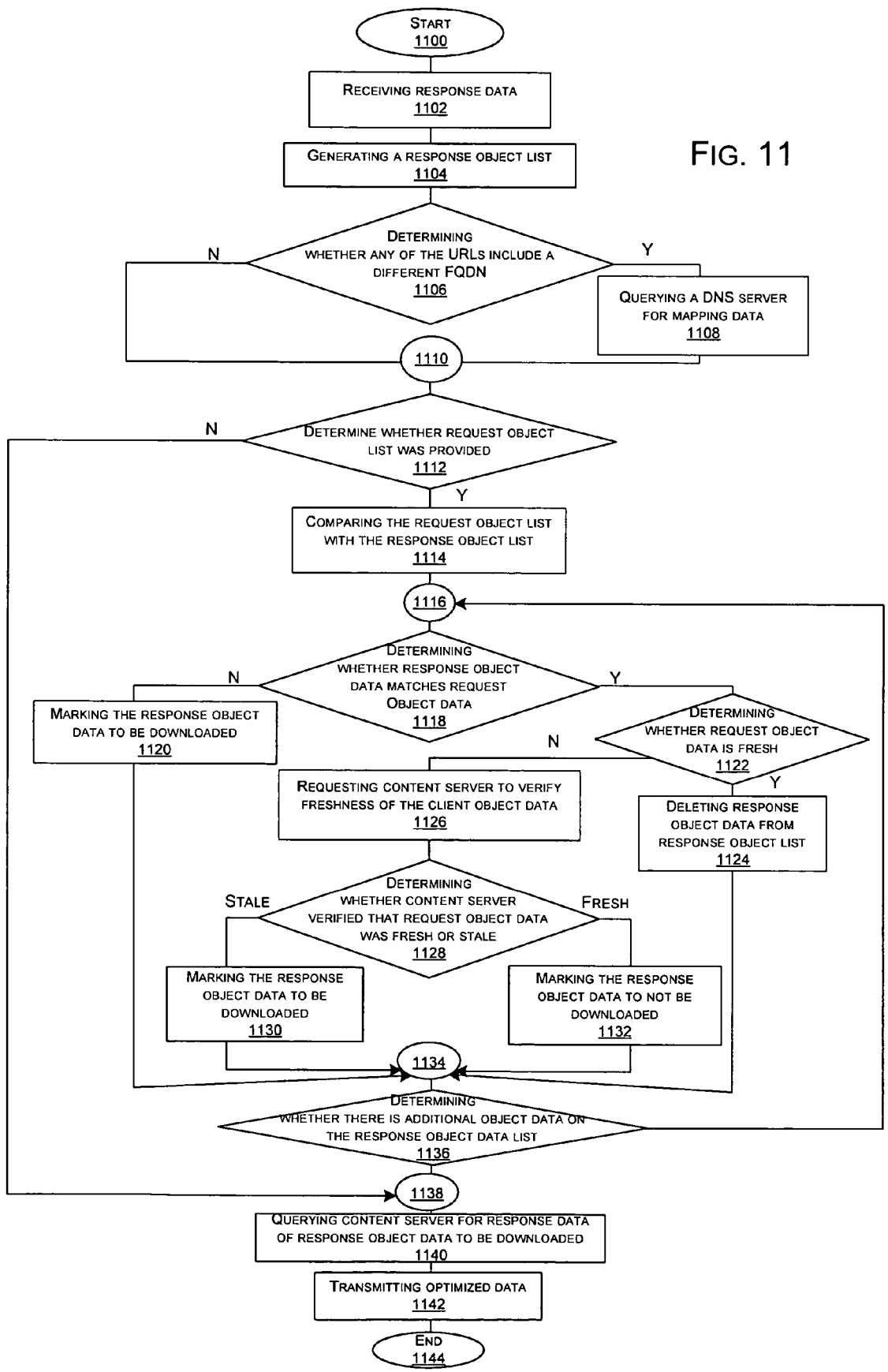

FIGS. 10 & 11 are flowcharts representing exemplary methods for providing object prediction at an OS. Referring to FIG. 10, it will be readily appreciated by one of ordinary skill in the art that the illustrated procedure can be altered to delete steps or further include additional steps. After initial start step 1000, the OS receives (1002) request data from the client device. In some embodiments, the request data may come from the user agent.

After the OS receives the request data, the OS can determine (1004) whether the request data includes a request object list. For example, the request object list may include request object data, such as URLs, and data relating to the request object data such as freshness data, FQDN of the request object data, and whether the request object data is to be downloaded. If the request data does not include the request object list, the method can proceed to connector 1010. Otherwise, if the request data does include the request object list, the OS can extract (1006) the request object list from the request data and provide (1008) the request object list to other hardware devices or software programs within the OS. For example, the provided request object list can correspond to the request object list determined to be provided in step 1112 in FIG. 11. The method can then proceed to connector 1010.

The OS can then forward (1012) the request data, without the request object list, to one or more contents servers. After the forwarding step 1012, the method can end (1014).

Referring to FIG. 11, it will be readily appreciated by one of ordinary skill in the art that the illustrated procedure can be altered to delete steps or further include additional steps. After initial start step 1100, an OS can receive (1102) response data from one or more content servers. For example, the response data can be the response data associated to the request data sent to the content server in step 1012 of FIG. 10.

After receiving the response data from the one or more content servers, the OS can generate (1104) a response object list based on the response data. The OS generates the response object list by analyzing the response data and parsing through the response data to identify the embedded response object data within the response data. For example, the response object data can include one or more URLS and the response data can be markup language content data of a requested web page wherein the markup language can be HyperText Markup Language (HTML), Extensible HTML (XHTML), Wireless Markup Language (WML), etc. For example, the response object list may include response object data, such as URLs, and data relating to the response object data such as freshness data, FQDN of the object data, and whether the response object data is to be downloaded.

After the generation, the OS can determine (1106) whether the response object data includes an FQDN different from an FQDN of the request object data provided. If the FQDN of the response object data is the same or similar to the FQDN of the request object data, the method can proceed to connector 1110. On the other hand, if the FQDN of the response object data is different from the FQDN of the request object data, the OS can query (1108) a DNS server by providing the FQDN and the DNS server can provide mapping data (e.g., an IP address) thereby providing the OS with mapping data that maps the FQDN to the IP address. The method can then proceed to connector 1110.

OS can determine (1112) whether the extracted request object list was provided. For example, the request object list may include request object data, such as URLs, and data relating to the request object data such as freshness data, FQDN of the request object data, and whether the object data is to be downloaded. If the extracted request object list was not provided, the method can proceed to connector 1138. Otherwise, if the extracted request object list was provided, the OS can compare (1114) the request object data within the request object list with the response object data within the response object list.

After the comparison, the OS determines (1118) whether a particular response object data matches any request object data. If there is not a match, the OS can mark (1120) the response object list that the particular response object data is to be downloaded and the method can proceed to connector 1134. On the other hand, if there is a match, the OS can determine (1122) whether the request object data that matches the response object data is fresh or stale. If the request object data is fresh, the OS can delete (1124) the matching response object data from the response object list and the method can proceed to connector 1134. Alternatively, in some embodiments, the OS can mark the response object list that the particular server object is not to be downloaded. If the request object data is stale, the OS can request (1126) the content server to verify the freshness of the request object data.

The OS can then determine (1128) whether the content server verified that the request object data was either fresh or stale. If the content server verified that the request object data was stale, the OS can mark (1130) the response object list that the particular response object data is to be downloaded and the method can proceed to connector 1134. Otherwise, if the content server verified that the request object data was fresh, the OS can mark (1132) the response object list that the particular response object data is not to be downloaded and the method can proceed to connector 1134.

Once the method has proceeded to connector 1134, the OS can determine (1136) whether there is any additional response object data that should be compared with any request object data. If so, the method proceeds to connector 1116. Otherwise, the method proceeds to connector 1138 and the OS can query (1140) the content server for any response data associated with the request object data that is to be downloaded to user agent. The OS provides the request object data that is to be downloaded to the user agent, if any exists, and the content server provides the corresponding response data. For example, this response data can be stored at the client device as predicted response data. After the querying, the OS can transmit (1142) optimized data to a client device or a user agent. The optimized data can include, among other things, the response data received from the content server and/or the response object list. In some embodiments, the optimized data can include any mapping data, any freshness data for the "fresh" stale object data, and/or response data corresponding to the request object data that is to be downloaded to the user agent. After transmitting the optimized data, the method can end (1144).

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed is:

1. A method comprising:
   receiving request data comprising request object data;
   transmitting the request data to a content server and receiving first response data associated with the request data;
   identifying response object data within the received first response data;
   acquiring mapping data from a DNS server and storing the mapping data at a DNS cache if the identified response object data includes a fully qualified domain name (FQDN) different from an FQDN of the request object data;
   determining whether the identified response object data is to be downloaded to a user agent;
   querying the content server for second response data that corresponds to the identified response object data based on the determination; and
   transmitting the received first response data along with the queried second response data to a client device having the user agent.

2. The method of claim 1, further comprising determining whether the identified response object data matches the request object data.

3. The method of claim 2, further comprising indicating that the identified response object data is to be downloaded if the identified response object data does not match the request object data.

4. The method of claim 2, further comprising determining whether the request object data is fresh or stale if the identified response object data matches the request object data.

5. The method of claim 4, further comprising indicating that the identified response object data can be deleted if the request object data is fresh.

6. The method of claim 4, further comprising determining whether the content server verified that the request object data was fresh or stale if the request object data is stale.

7. The method of claim 6, further comprising indicating that the identified response object data is to be downloaded if the content server verifies that the matching request object data is stale.

8. The method of claim 6, further comprising indicating that the identified response object data is not to be downloaded if the content server verifies that the matching request object data is fresh.

9. The method of claim 8, further comprising updating a freshness cache so that the client device can notify the user agent that subsequent request object data that is marked as stale is fresh.

10. The method of claim 8, further comprising updating content data from stale to fresh at a data cache of the user agent.

11. The method of claim 1, further comprising receiving subsequent request data and identifying subsequent request object data within the subsequent request data.

12. The method of claim 11, further comprising determining whether the identified subsequent request object data corresponds to the queried second response data.

13. The method of claim 12, further comprising transmitting the stored second response data to the user agent if the identified subsequent request object data corresponds to the stored second response data.

14. The method of claim 12, further comprising transmitting the identified subsequent request object data to the content server if the identified subsequent request object data does not correspond to the stored second response data.

15. The method of claim 1, wherein querying the content server includes:
   constructing request data corresponding to the identified response object data based on the determination;
   transmitting the constructed request data to the content server; and
   receiving the second response data, wherein the second response data is associated with the constructed request data.

16. A method comprising:
   receiving optimized data associated with a request for a web page, wherein the received optimized data includes first response data associated with the request and an object list providing object data;
   after receiving the optimized data, querying a user agent by a client device comprising the user agent to determine whether the object data is marked as fresh in the user agent;
   providing the received first response data to the user agent;
   constructing request data corresponding to the object data based on the determination;
   transmitting the constructed request data to an optimization server configured to query a content server for second response data;
   receiving, by the client device, the second response data from the optimization server, wherein the second response data is associated with the constructed request data; and
   storing the received second response data, wherein the received second response data can be provided to the user agent in a subsequent request.

17. The method of claim 16, further comprising receiving subsequent request data and identifying subsequent request object data within the received subsequent request data.

18. The method of claim 17, further comprising determining whether the identified subsequent request object data corresponds to the stored second response data.

19. The method of claim 18, further comprising transmitting the stored second response data to the user agent if the identified subsequent request object data corresponds to the stored second response data.

20. The method of claim 18, further comprising transmitting the identified subsequent request object data to the content server if the identified subsequent request object data does not correspond to the stored second response data.

21. The method of claim 16, further comprising separating the received optimized data into mapping data that is stored at a DNS cache, wherein the mapping data assists in constructing the request data corresponding to the object data.

22. The method of claim 16, further comprising separating the received optimized data into freshness data of stale request object data that has been determined to be fresh, wherein the freshness data notifies the user agent that the stale request object data is fresh.

23. A method comprising:
receiving response data associated with a request for a web page;
generating a response object list that identifies the response object data within the received response data;
determining whether the identified response object data is to be downloaded to a user agent;
updating the generated response object list based on the determination;
transmitting, to a mobile device having the user agent, optimized data that includes received response data and the updated response object list, wherein the identified response object data within the updated response object list is used to construct request data that provides a predicted response data based on the determination, wherein the predicted response data can be provided to the user agent in a subsequent request, and wherein the request data comprises a request object list identifying request object data; and
acquiring mapping data from a DNS server and storing the mapping data at a DNS cache if the response object data includes a fully qualified domain name (FQDN) different from an FQDN of the request object data.

24. The method of claim 23, further comprising determining whether the identified response object data matches the identified request object data.

25. The method of claim 24, further comprising indicating that the identified response object data is to be downloaded if the identified response object data does not match the identified request object data.

26. The method of claim 24, further comprising determining whether the identified request object data is fresh or stale if the identified response object data matches the identified request object data.

27. The method of claim 26, further comprising verifying with the content server that the identified request object data was fresh or stale if the identified request object data is stale.

28. The method of claim 27, further comprising indicating that the identified response object data is to be downloaded if the identified request object data has been verified to be stale.

29. The method of claim 27, further comprising indicating that the identified response object data is not to be downloaded if the identified request object data has been verified to be fresh.

30. The method of claim 24, further comprising indicating that the identified request object data can be deleted if the identified request object data is fresh.

31. A method comprising:
receiving response data from a content server, wherein the response data corresponds to request data received from a client device;
identifying response object data within the response data;
determining whether the identified response object data includes a fully qualified domain name (FQDN) different from an FQDN of request object data, wherein the request object data is associated with the request data received from the client device;
receiving any existing mapping data based on the determination, wherein the mapping data corresponds to the FQDN of the response object data;
storing any existing mapping data into a DNS cache, wherein the mapping data can assist in constructing predicted request data;
determining whether the identified response object data is to be downloaded to a user agent; and
querying the content server for second response data that corresponds to the identified response object data based on the determination.

32. The method of claim 31, further comprising determining whether mapping data exists at the DNS cache when the mapping data of the request object data is requested.

33. The method of claim 32, further comprising constructing the predicted request data with the mapping data stored at the DNS cache if the mapping data exists at the DNS cache.

34. The method of claim 31, wherein the mapping data is an IP address of the FQDN of the response object data.

35. A system comprising:
a client device comprising a user agent, the client device configured to receive request data from the user agent and transmit the request data, wherein the request data corresponds to a request for a web page; and
an optimization server configured to receive the request data, communicate with a content server, wherein the communication includes the ability to transmit the request data to the content server and receive first response data associated with the request data, generating a response object list that identifies the response object data of the received first response data, and transmit the received first response data and the generated response object list to the client device,
wherein the client device is configured, after receiving the response object list, to query the user agent to determine whether the response object data of the received first response data is marked as fresh in the user agent, provide the received first response data to the user agent, construct request data that is associated with the response object data based on the determination, transmit the constructed request data to the optimization server, receive second response data associated with the constructed request data, and store the received second response data, wherein the received second response data can be provided to the user agent in a subsequent request.

36. The system of claim 35, wherein the client device is configured to receive mapping data from the optimization server and store the mapping data, which can assist in constructing the request data that is associated with the response object data.

37. A system comprising:
a client device configured to receive request data from a user agent and transmit the request data, wherein the request data corresponds to a request for a web page; and
an optimization server configured to receive the request data, communicate with a content server, wherein the communication includes the ability to transmit the received request data to the content server and receive first response data associated with the received request data, identify response object data of the received first response data, acquire mapping data from a DNS server and store the mapping data at a DNS cache if the identified response object data includes a fully qualified domain name (FQDN) different from an FQDN of the request object data, determine whether the identified response object data is to be downloaded to the user agent, query the content server for second response data corresponding to the identified response object data based on the determination, and transmit to the client device the received first response data along with the queried second response data, wherein the client device is configured to provide the transmitted first response data to the user agent and store the queried second response data, which can be provided to the user agent in a subsequent request, and wherein determining whether the identified response object data is to be downloaded to the user agent comprises determining whether the identified response object data matches the identified request object data and whether the identified request object data is fresh or stale.

38. A non-transitory computer-readable storage device that stores a set of instructions that are executable by a client device causing the client device to perform a method, the method comprising:

receiving optimized data associated with a request for a web page, wherein the received optimized data includes first response data associated with the request and an object list providing object data;

after receiving the optimized data, querying a user agent to determine whether the provided object data is marked as fresh in the user agent, wherein the client device comprises the user agent;

providing the received first response data to the user agent;

constructing request data corresponding to the provided object data based on the determination;

transmitting the constructed request data to an optimization server configured to query a content server for second response data;

receiving the second response data from the optimization server, wherein the received second response data is associated with the constructed request data; and storing the received second response data, wherein the received second response data can be provided to the user agent in a subsequent request.

39. A non-transitory computer-readable storage device that stores a set of instructions that are executable by an optimization server causing the optimization server to perform a method, the method comprising:

receiving response data associated with a request for a web page;

generating an object list that identifies the object data within the received response data;

determining whether the identified object data is to be downloaded to a user agent;

updating the generated object list based on the determination; and transmitting, to a mobile device having the user agent, optimized data that includes received response data along with the updated object list, wherein the identified object data within the updated object list can be used to construct request data that provides a predicted response data based on the determination, wherein the provided predicted response data can be transferred to the user agent in a subsequent request, and wherein the request data comprises a request object list identifying request object data; and acquiring mapping data from a DNS server and storing the mapping data at a DNS cache if the object data includes a fully qualified domain name (FQDN) different from an FQDN of the request object data.

* * * * *